(12) United States Patent
Tsuruta et al.

(10) Patent No.: US 10,208,212 B2
(45) Date of Patent: Feb. 19, 2019

(54) NEAR-INFRARED ABSORPTION COMPOSITION, CURABLE COMPOSITION, CURED FILM, NEAR-INFRARED CUT FILTER, SOLID-STATE IMAGING DEVICE, INFRARED SENSOR, CAMERA MODULE, PROCESSED COLORING AGENT, AND METHOD OF MANUFACTURING PROCESSED COLORING AGENT

(71) Applicant: FUJIFILM Corporation, Tokyo (JP)

(72) Inventors: Takuya Tsuruta, Haibara-gun (JP); Kyouhei Arayama, Haibara-gun (JP); Kazutaka Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/463,382

(22) Filed: Mar. 20, 2017

(65) Prior Publication Data

US 2017/0190923 A1 Jul. 6, 2017

Related U.S. Application Data

(63) Continuation of application No. PCT/JP2015/075404, filed on Sep. 8, 2015.

(30) Foreign Application Priority Data

Oct. 3, 2014 (JP) .................................. 2014-204410

(51) Int. Cl.
*C09D 5/32* (2006.01)
*C09D 7/40* (2018.01)
(Continued)

(52) U.S. Cl.
CPC .................. *C09D 5/32* (2013.01); *C08K 9/10* (2013.01); *C09B 23/0075* (2013.01);
(Continued)

(58) Field of Classification Search
None
See application file for complete search history.

(56) References Cited

U.S. PATENT DOCUMENTS 6,136,488 A * 10/2000 Kushino ............... G03G 9/0806
430/108.21
6,542,292 B2 * 4/2003 Onomichi .............. G02B 5/208
252/582

(Continued)

FOREIGN PATENT DOCUMENTS

EP 2048531 A1 4/2009
EP 2048539 A1 4/2009
(Continued)

OTHER PUBLICATIONS

English translation of the International Search Report, issued in PCT/JP2015/075404, PCT/ISA/210, dated Dec. 15, 2015.
(Continued)

*Primary Examiner* — Michelle Mandala
(74) *Attorney, Agent, or Firm* — Birch, Stewart, Kolasch & Birch, LLP

(57) ABSTRACT

The near-infrared absorption composition includes a processed coloring agent obtained by coating a near-infrared absorption coloring agent with a resin having one or more selected from a coloring agent structure, a heterocyclic structure, and an acyclic hetero atom-containing group. The near-infrared absorption coloring agent is preferably one or more selected from a phthalocyanine coloring agent, a perylene coloring agent, a pyrrolopyrrole coloring agent, a cyanine coloring agent, a dithiol metal complex coloring agent, a naphthoquinone coloring agent, a diimmonium coloring agent, an azo coloring agent, and a squarylium coloring agent and more preferably a pyrrolopyrrole coloring agent.

19 Claims, 1 Drawing Sheet

(51) Int. Cl.
  *C08K 9/10* (2006.01)
  *C09B 47/04* (2006.01)
  *C09B 57/00* (2006.01)
  *C09D 133/14* (2006.01)
  *G02B 1/04* (2006.01)
  *G02B 5/20* (2006.01)
  *H01L 27/146* (2006.01)
  *C09B 23/01* (2006.01)
  *C09B 23/04* (2006.01)
  *C09B 47/067* (2006.01)
  *C09B 67/08* (2006.01)
  *C09B 69/10* (2006.01)

(52) U.S. Cl.
  CPC .............. *C09B 23/04* (2013.01); *C09B 47/04* (2013.01); *C09B 47/0675* (2013.01); *C09B 57/00* (2013.01); *C09B 57/004* (2013.01); *C09B 67/0013* (2013.01); *C09B 69/109* (2013.01); *C09D 7/68* (2018.01); *C09D 133/14* (2013.01); *G02B 1/04* (2013.01); *G02B 5/208* (2013.01); *H01L 27/14625* (2013.01); *C08K 2201/003* (2013.01)

(56) References Cited

U.S. PATENT DOCUMENTS

| | | | |
|---|---|---|---|
| 2003/0086159 A1* | 5/2003 | Suzuki | G02B 1/111 359/361 |
| 2011/0070407 A1 | 3/2011 | Kato et al. | |
| 2015/0287756 A1 | 10/2015 | Ezoe et al. | |

FOREIGN PATENT DOCUMENTS

| | | |
|---|---|---|
| JP | 2009-149849 A | 7/2009 |
| JP | 2011-68731 A | 4/2011 |
| JP | 2013/103956 A | 5/2013 |
| WO | WO 2013/170934 A1 | 11/2013 |
| WO | WO 2014/084288 A1 | 6/2014 |

OTHER PUBLICATIONS

English translation of the Written Opinion of the International Searching Authority, issued in PCT/JP2015/075404, PCT/ISA/237, dated Dec. 15, 2015.
Extended European Search Report issued in European Application No. 15846521.1, dated Jul. 28, 2017.
Fang et al., "A review of near infrared reflectance properties of metal oxide nanostructures," GNS Science Report 2013/39, https://pdfs.semanticscholar.org/9832/fb09f27020da054bdee87e6190fb568b35fb.pdf, XP055392467, Jul. 1, 2013, pp. 1-20 (26 pages total).
Japanese Notification of Reasons for Refusal for Japanese Application No. 2016-551682, dated Oct. 31, 2017, with an English translation.
International Search Report, issued in PCT/JP2015/075404, PCT/ISA/210, dated Dec. 15, 2015.
Written Opinion of the International Searching Authority, issued in PCT/JP2015/075404, PCT/ISA/237, dated Dec. 15, 2015.
Korean Notification of Reason for Refusal for corresponding Korean Application No. 10-2017-7008720, dated Jul. 1, 2018, with English translation.
Korean Office Action for Korean Application No. 10-2017-7008720, dated Nov. 28, 2018, with English translation.
Taiwanese Office Action and Search Report, dated Sep. 26, 2018, for corresponding Taiwanese Application No. 104131531, with an English translation of the Office Action.
Office Action dated Nov. 26, 2018, in Chinese Patent Application No. 201580053145.0, with English translation.

* cited by examiner

NEAR-INFRARED ABSORPTION COMPOSITION, CURABLE COMPOSITION, CURED FILM, NEAR-INFRARED CUT FILTER, SOLID-STATE IMAGING DEVICE, INFRARED SENSOR, CAMERA MODULE, PROCESSED COLORING AGENT, AND METHOD OF MANUFACTURING PROCESSED COLORING AGENT

CROSS-REFERENCE TO RELATED APPLICATIONS

This application is a Continuation of PCT International Application No. PCT/JP2015/75404, filed on Sep. 8, 2015, which claims priority under 35 U.S.C. § 119(a) to Japanese Patent Application No. 2014-204410, filed on Oct. 3, 2014. Each of the above application(s) is hereby expressly incorporated by reference, in its entirety, into the present application.

BACKGROUND OF THE INVENTION

1. Field of the Invention

The invention relates to a near-infrared absorption composition, a curable composition, a cured film, a near-infrared cut filter, a solid-state imaging device, an infrared sensor, a camera module, a processed coloring agent, and a method of manufacturing a processed coloring agent.

2. Description of the Related Art

In a video camera, a digital still camera, or a cellular phone with a camera function, a charge coupled device (CCD) or a complementary metal oxide semiconductor (CMOS) which is a solid-state imaging device for a color image is used. In such a solid-state imaging device, a silicon photodiode having sensitivity to a near-infrared ray in a light receiving section thereof is used. Therefore, visibility correction is required and near-infrared cut filters and the like are used in many cases.

As a compound having a near-infrared absorption function, a pyrrolopyrrole coloring agent or the like is known (for example, JP2011-68731A).

Meanwhile, in JP2009-149849A, a processed pigment obtained by coating a pigment having a maximum absorption wavelength in a visible range with a block copolymer having a pigment adsorptive block and a pigment non-adsorptive block is disclosed.

SUMMARY OF THE INVENTION

In a case where coloring agent particles are used in a solid dispersion state, if adsorbing properties of the coloring agent to a coloring agent derivative or a dispersion resin are low, there is a tendency in that dispersibility of a coloring agent in a composition decreases.

A near-infrared absorption coloring agent may not be subjected to a surface treatment, and thus dispersibility in a composition to such a near-infrared absorption coloring agent easily decreases. Therefore, further improvement of dispersibility is desirable.

According to the review of the inventors, it has been understood that a composition including a near-infrared absorption coloring agent tends to have high thixotropy. If the thixotropy is high, when spin coating is performed, a thickness of a coated film in the center and the circumference of spin coating varies, such that in-plane evenness decreases. Therefore, it is desirable that the thixotropy is low.

Accordingly, an object of the invention is to provide a near-infrared absorption composition having high dispersibility of the near-infrared absorption coloring agent and small thixotropy, a curable composition, a cured film, a near-infrared cut filter, a solid-state imaging device, an infrared sensor, a camera module, a processed coloring agent, and a method of manufacturing a processed coloring agent.

The invention has diligently conducted research so as to find that it is possible to provide a processed coloring agent having high dispersibility and low thixotropy by coating a near-infrared absorption coloring agent with a resin having one or more selected from a coloring agent structure, a heterocyclic structure, and an acyclic hetero atom-containing group, such that the invention is completed. The invention provides the following.

<1> A near-infrared absorption composition comprising: a processed coloring agent obtained by coating at least a portion of surfaces of primary particles of a near-infrared absorption coloring agent with a resin having one or more selected from a coloring agent structure, a heterocyclic structure, and an acyclic hetero atom-containing group.

<2> The near-infrared absorption composition according to <1>, in which an average primary particle diameter of the processed coloring agent is 200 nm or less.

<3> The near-infrared absorption composition according to <1> or <2>, in which the near-infrared absorption coloring agent has a maximum absorption wavelength in a range of 700 to 1,200 nm.

<4> The near-infrared absorption composition according to any one of <1> to <3>, in which the near-infrared absorption coloring agent is one or more selected from a phthalocyanine coloring agent, a perylene coloring agent, a pyrrolopyrrole coloring agent, a cyanine coloring agent, a dithiol metal complex coloring agent, a naphthoquinone coloring agent, a diimmonium coloring agent, an azo coloring agent, and a squarylium coloring agent.

<5> The near-infrared absorption composition according to any one of <1> to <4>, in which the near-infrared absorption coloring agent is a pyrrolopyrrole coloring agent.

<6> The near-infrared absorption composition according to any one of <1> to <5>, in which the near-infrared absorption coloring agent is a compound represented by Formula (1) below;

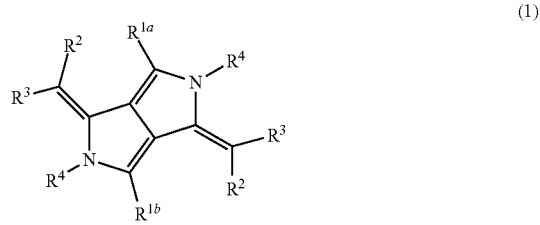

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from $R^{1a}$, $R^{1b}$, and $R^3$, and $R^{4A}$ and $R^{4B}$ each independently represent a hydrogen atom or a substituent.

<7> The near-infrared absorption composition according to any one of <1> to <6>, in which a solubility of the near-infrared absorption coloring agent to a solvent having an SP value of 25 $(cal/cm^3)^{0.5}$ or less at 25° C. is 1.0 mass % or less.

<8> The near-infrared absorption composition according to any one of <1> to <7>, in which the coloring agent structure that the resin of the processed coloring agent has is a coloring agent structure derived from one or more coloring agents selected from a pyrrolopyrrole coloring agent, a quinacridone coloring agent, an anthraquinone coloring agent, a benzoisoindole coloring agent, a thiazine indigo coloring agent, an azo coloring agent, a quinophthalone coloring agent, a phthalocyanine coloring agent, a dioxazine coloring agent, a perylene coloring agent, a perinone coloring agent, a benzimidazolone coloring agent, a benzothiazole coloring agent, a benzimidazole coloring agent, and a benzoxazole coloring agent, in which the heterocyclic structure that the resin of the processed coloring agent has is one or more selected from thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, dioxane, trithiane, isoindoline, isoindolinone, benzimidazolone, benzimidazole, benzothiazole, succinimide, phthalimide, naphthalimide, hydantoin, indole, quinoline, carbazole, acridine, acridone, and anthraquinone, and in which an acyclic hetero atom-containing group that the resin of the processed coloring agent has is one or more selected from a urea group, an imido group, an amide group, and a sulfonamide group.

<9> The near-infrared absorption composition according to any one of <1> to <8>, in which the resin of the processed coloring agent includes one or more selected from a (meth) acrylic resin, a styrene resin, a (meth)acrylic/styrene resin, a urethane resin, an imide resin, a urea resin, an epoxy resin, and an ester resin.

<10> The near-infrared absorption composition according to any one of <1> to <9>, in which the resin of the processed coloring agent includes one or more selected from a (meth) acrylic resin, a styrene resin, and a (meth)acrylic/styrene resin.

<11> The near-infrared absorption composition according to any one of <1> to <10>, in which the resin of the processed coloring agent is one selected from a resin having a weight-average molecular weight of 2,000 to 200,000, a resin having an acid value of less than 200 mgKOH/g, and a resin having a weight-average molecular weight of 2,000 to 200,000 and an acid value of less than 200 mgKOH/g.

<12> The near-infrared absorption composition according to any one of <1> to <11>, in which in the processed coloring agent, a mass ratio of the near-infrared absorption coloring agent and the resin is 1:0.01 to 1:2.

<13> A curable composition comprising: the near-infrared absorption composition according to any one of <1> to <12>; and a curable compound.

<14> A cured film formed of the curable composition according to <13>.

<15> A near-infrared cut filter formed of the curable composition according to <13>.

<16> A solid-state imaging device comprising: the cured film formed of the curable composition according to <13>.

<17> An infrared sensor comprising: a cured film formed of the curable composition according to <13>.

<18> A camera module comprising: a solid-state imaging device; and the near-infrared cut filter according to <15>.

<19> A processed coloring agent obtained by coating at least a portion of primary particles of a near-infrared absorption coloring agent with a resin having one or more selected from a coloring agent structure, a heterocyclic structure, and an acyclic hetero atom-containing group.

<20> A method of manufacturing a processed coloring agent comprising: performing a pulverizing treatment on a near-infrared absorption coloring agent in presence of a resin having one or more selected from a coloring agent structure, a heterocyclic structure, and an acyclic hetero atom-containing group.

According to the invention, it is possible to provide a near-infrared absorption composition having high dispersibility of a near-infrared absorption coloring agent and low thixotropy, a curable composition, a cured film, a near-infrared cut filter, a solid-state imaging device, an infrared sensor, a camera module, a processed coloring agent, and a method of manufacturing a processed coloring agent.

DESCRIPTION OF THE PREFERRED EMBODIMENTS

Figure 1:
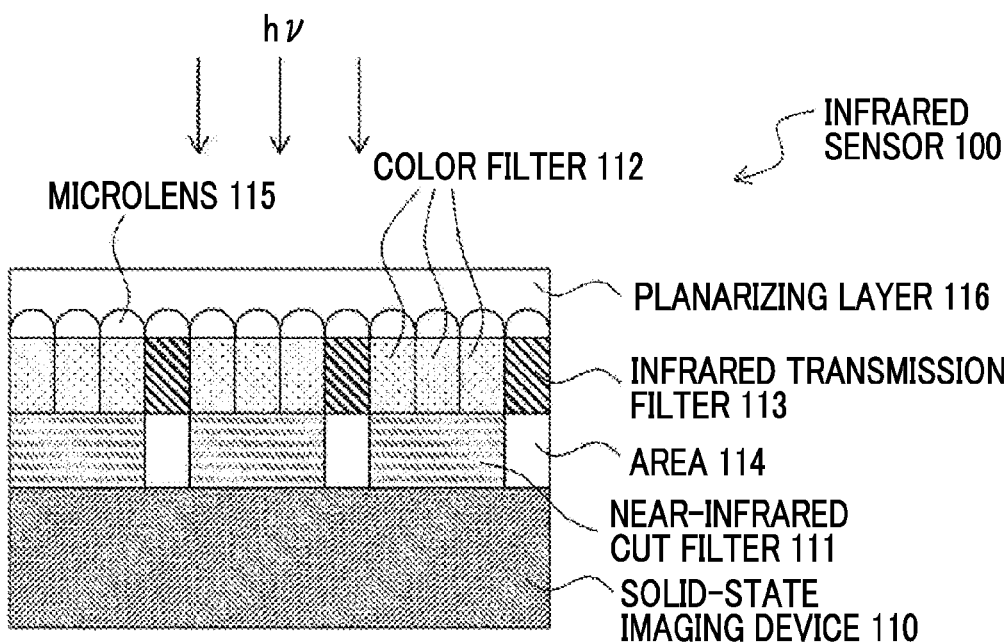
FIG. 1 is a cross-sectional view schematically illustrating a configuration of an infrared sensor according to an embodiment of the invention.

Hereinafter, the content of the invention is described in detail. In this specification, the expression "to" is used in a meaning of including numerical values indicated before and after the expression as a lower limit and an upper limit.

In this specification, "(meth)acrylate" represents both or any one of "acrylate" and "methacrylate", "(meth)allyl" represents both or any one of "allyl" and "methallyl", "(meth)acryloyl" represents both or any one of "acryloyl" and "methacryloyl", and"(meth)acryl" represents both or any one of "acryl" and "methacryl".

In the description of a group (atomic group) in this specification, a denotation without substitution and unsubstitution include a group with a substituent, together with a group without a substituent. For example, an "alkyl group" includes not only an alkyl group (unsubstituted alkyl group) without a substituent but also an alkyl group (substituted alkyl group) with a substituent.

In this specification, in the description of a group (atomic group), a denotation without substitution and unsubstitution includes a group (atomic group) with a substituent, together with a group (atomic group) without a substituent.

In this specification, a near-infrared ray refers to light having a wavelength range of 700 to 2,500 nm (electromagnetic wave).

In this specification, a total solid content refers to a total mass of components except for a solvent from the entire content of a composition.

In this specification, a solid content is a solid content at 25° C.

In this specification, a weight-average molecular weight is defined as a value in terms of polystyrene by GPC measurement. In this specification, a weight-average molecular weight (Mw) and a number-average molecular weight (Mn) can be obtained, for example, by using HLC-8220 (manufactured by Tosoh Corporation), using TSK gel Super AWM-H (manufactured by Tosoh Corporation, 6.0 mm ID×15.0 cm) as a column, and using a 10 mmol/L lithium bromide NMP (N-methylpyrrolidinone) solution as an eluent.

In this specification, Me in a chemical formula represents a methyl group, Et represents an ethyl group, and Ph represents a phenyl group.

<Near-infrared Absorption Composition>

The near-infrared absorption composition of the invention contains a processed coloring agent obtained by coating at least a portion of surfaces of primary particles of a near-infrared absorption coloring agent with a resin having one or more selected from a coloring agent structure, a heterocyclic structure, and an acyclic hetero atom-containing group.

According to the invention, it is possible to provide a processed coloring agent having high dispersibility and small thixotropy by coating the near-infrared absorption coloring agent with the resin. The mechanism providing this effect is assumed as follows. The near-infrared absorption coloring agent has low adsorbing properties with respect to a dispersing agent or a coloring agent derivative on a surface of a coloring agent. In a case where the surface of the near-infrared absorption coloring agent is not coated with the resin, when the composition is left still, weak cohesion force works. When shearing force such as rotational force is applied, cohesion force is cut off, and thus the viscosity decreases (exhibition of thixotropy). However, it is considered that when the at least a portion of the surface of the near-infrared absorption coloring agent is coated with the resin, the resin strongly absorbs on the surface of the near-infrared absorption coloring agent, the near-infrared absorption coloring agent can thoroughly disperse in the composition even in a stationary state, and cohesion force does not work between the near-infrared absorption coloring agents. This improves dispersibility or thixotropy. Here, the thixotropy is physical properties of a fluid in which viscosity is high in general or when low shearing force works, and viscosity is low when high shearing force works.

The processed coloring agent according to the invention is in a state different from a state in which a near-infrared absorption coloring agent that is not coated with the resin (also referred to as an unprocessed coloring agent) are dispersed in the composition including a resin. when the unprocessed coloring agent is in the composition, primary particles generally aggregate to form secondary particles, and thus a resin exists around the secondary particles. In contrast, the processed coloring agent according to the invention is different in that the resin adsorbs on the surfaces of the primary particles of the near-infrared absorption coloring agent to form a coated layer. Here, the primary particles refer to independent particles with no aggregation.

<<Processed Coloring Agent>>

With respect to the processed coloring agent according to the invention, at least a portion of the surfaces of the primary particles of the near-infrared absorption coloring agent is coated with the resin. The surfaces of the primary particles of the near-infrared absorption coloring agent may be completely coated with the resin, or a portion of the surfaces of the primary particles of the near-infrared absorption coloring agent may be exposed.

Here, a coating ratio of the resin can be calculated by measuring a ratio (isolation ratio) in which the resin isolates from the processed coloring agent. An isolation amount of the resin can be calculated by washing the processed coloring agent with 1-methoxy-2-propanol. Specifically, 10 g of the processed coloring agent is input to 100 ml of 1-methoxy-2-propanol, shaking is performed for three hours at room temperature with a shaking machine. Subsequently, particles (near-infrared absorption coloring agent) are precipitated at 80,000 rpm over eight hours with a centrifuge, the solid content of the supernatant liquid portion is obtained by a drying method. A mass of the resin isolated from the processed coloring agent is obtained, and an isolation ratio (%) is calculated from the ratio of the mass of the isolated resin and the ratio of the resin used in the initial treatment.

An isolation ratio of a processed coloring agent such as a commercially available processed coloring agent can be measured in the method below. That is, after the entire processed coloring agent is dissolved in a solvent (for example, dimethyl sulfoxide, dimethylformamide, formic acid, and sulfuric acid) that dissolves the near-infrared absorption coloring agent, separation is performed with an organic solvent by using a difference of solubility between the resin and the near-infrared absorption coloring agent, and a "mass of the resin used in the initial treatment" is calculated. Independently, the processed coloring agent is washed with 1-methoxy-2-propanol, the obtained isolation amount is divided by the "mass of the resin used in the initial treatment", so as to obtain an isolation ratio (%).

As the isolation ratio of the resin is smaller, the coating ratio to the near-infrared absorption coloring agent is high, and dispersibility and dispersion stability are satisfactory. The preferable range of the isolation ratio of the resin is 30% or less, more preferably 20% or less, and most preferably 15% or less. Ideally, the isolation ratio is 0%.

In the processed coloring agent according to the invention, the mass ratio of the near-infrared absorption coloring agent and the resin preferably satisfies "near-infrared absorption coloring agent:resin=1:0.01 to 1:2", more preferably satisfies "1:0.05 to 1:1", and even more preferably satisfies "1:0.1 to 1:0.6". According to this aspect, the aforementioned effect can be easily obtained.

According to the invention, an average primary particle diameter of the processed coloring agent is preferably 200 nm or less. The upper limit is preferably 100 nm or less, more preferably 90 nm or less, and even more preferably 50 nm or less. The lower limit is preferably 10 nm or greater and more preferably 15 nm or greater. If the average primary particle is in this range, there are effects in that dispersion can be performed without aggregation of the processed coloring agents with each other, and pattern forming properties become satisfactory.

According to the invention, the average primary particle diameter dilutes the pigment dispersion liquid with propylene glycol monomethyl ether acetate, and is added dropwise to a mesh for electron microscopy, TEM observation (TEM: Jeol Ltd., 1200EX, Acceleration voltage: 80 kV, Observation magnification: ×100 K) is performed after drying, and 500 particles are extracted, so as to measure a value.

Hereinafter, the processed coloring agent is described in detail.

<<<Near-infrared Absorption Coloring Agent>>>

In the near-infrared absorption coloring agent according to the invention, a compound having the maximum absorption wavelength of preferably in the range of 700 to 1,200 nm and more preferably in the range of 700 to 1,000 nm is preferable. Specifically, one or more selected from a phthalocyanine coloring agent (including naphthalocyanine coloring agent), a perylene coloring agent, a pyrrolopyrrole coloring agent, a cyanine coloring agent, a dithiol metal complex coloring agent, a naphthoquinone coloring agent, a diimmonium coloring agent, an azo coloring agent, and a squarylium coloring agent is preferable, and a pyrrolopyrrole coloring agent is more preferable. The pyrrolopyrrole coloring agent is preferably a pyrrolopyrrole boron coloring agent. A pyrrolopyrrole coloring agent has excellent near-infrared absorption properties and excellent invisibility, and thus it is easily obtain a near-infrared cut filter having excellent near-infrared blocking properties and excellent visible transmission properties. A pyrrolopyrrole coloring agent is a coloring agent having low adsorbing properties on the surface of the coloring agent and particularly easily exhibiting thixotropy. However, if the pyrrolopyrrole coloring agent is coated with the resin, thixotropy is prominently improved, and thus the effect of the invention can be prominently exhibited.

Examples of the pyrrolopyrrole coloring agent include compounds disclosed in paragraph numbers 0016 to 0058 of JP2009-263614A.

As a phthalocyanine coloring agent, a naphthalocyanine coloring agent, a diimmonium coloring agent, a cyanine coloring agent, and a squarylium coloring agent, compounds disclosed in paragraphs 0010 to 0081 of JP2010-111750A may be used, and the contents thereof are incorporated to this specification. As a cyanine coloring agent, for example, "Functional coloring agents, by Makoto Okawara, Masaru Matsuoka, Teijiro Kitao, and Tsuneaki Hirashima, Kodansha Scientific Ltd." can be referred to, and the contents thereof are incorporated to this specification.

The near-infrared absorption coloring agent used in the invention is preferably a compound represented by Formula (1) below.

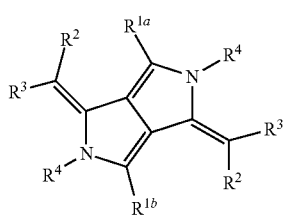

(1)

In Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from $R^{1a}$, $R^{1b}$, and $R^3$, and $R^{4A}$ and $R^{4B}$ each independently represent a hydrogen atom or a substituent.

In Formula (1), the number of carbon atoms of an alkyl group represented by $R^{1a}$ or $R^{1b}$ is preferably 1 to 30, more preferably 1 to 20, and particularly preferably 1 to 10.

The number of carbon atoms of an aryl group represented by $R^{1a}$ or $R^{1b}$ is preferably 6 to 30, more preferably 6 to 20, and particularly preferably 6 to 12.

The number of carbon atoms of the heteroaryl group represented by $R^{1a}$ or $R^{1b}$ is preferably 1 to 30 and more preferably 1 to 12. Examples of the hetero atom include a nitrogen atom, an oxygen atom, and a sulfur atom.

A group represented by $R^{1a}$ or $R^{1b}$ is preferably an aryl group having an alkoxy group having a branched alkyl group. The number of carbon atoms of the branched alkyl group is preferably 3 to 30 and more preferably 3 to 20.

Examples of the group represented by $R^{1a}$ or $R^{1b}$ include 4-(2-ethylhexyloxy)phenyl, 4-(2-methylbutyloxy)phenyl, and 4-(2-octyldodecyloxy)phenyl.

$R^{1a}$ and $R^{1b}$ in Formula (1) may be identical to or different from each other.

$R^2$ and $R^3$ each independently represent a hydrogen atom or a substituent. $R^2$ and $R^3$ are bonded to each other to form a ring. At least one of $R^2$ or $R^3$ is preferably an electron-withdrawing group. It is preferable that $R^2$ and $R^3$ each independently represent a cyano group or a heterocyclic group.

Examples of the substituent include substituents disclosed in paragraph numbers 0020 to 0022 of JP2009-263614A. The contents are incorporated to this specification.

Examples of the substituent include a substituent T below.
(Substituent T)

An alkyl group (preferably having 1 to 30 carbon atoms), an alkenyl group (preferably having 2 to 30 carbon atoms), an alkynyl group (preferably having 2 to 30 carbon atoms), an aryl group (preferably having 6 to 30 carbon atoms), an amino group (preferably having 0 to 30 carbon atoms), an alkoxy group (preferably having 1 to 30 carbon atoms), an aryloxy group (preferably having 6 to 30 carbon atoms), an aromatic heterocyclic oxy group (preferably having 1 to 30 carbon atoms), an acyl group (preferably having 1 to 30 carbon atoms), an alkoxycarbonyl group (preferably 2 to 30 carbon atoms), an aryloxycarbonyl group (preferably having 7 to 30 carbon atoms), an acyloxy group (preferably having 2 to 30 carbon atoms), an acylamino group (preferably having 2 to 30 carbon atoms), an alkoxycarbonylamino group (preferably having 2 to 30 carbon atoms), an aryloxycarbonylamino group (preferably having 7 to 30 carbon atoms), a sulfonylamino group (preferably having 1 to 30 carbon atoms), a sulfamoyl group (preferably having 0 to 30 carbon atoms), a carbamoyl group (preferably having 1 to 30 carbon atoms), an alkylthio group (preferably having 1 to 30 carbon atoms), an arylthio group (preferably having 6 to 30 carbon atoms), an aromatic heterocyclic thio group (preferably having 1 to 30 carbon atoms), a sulfonyl group (preferably having 1 to 30 carbon atoms), a sulfinyl group (preferably having 1 to 30 carbon atoms), an ureido group (preferably having 1 to 30 carbon atoms), a phosphoric acid amide group (preferably having 1 to 30 carbon atoms), a hydroxy group, a mercapto group, a halogen atom, a cyano group, a sulfo group, a carboxyl group, a nitro group, a hydroxamic acid group, a sulfino group, a hydrazino group, an imino group, and a heteroaryl group (preferably having 1 to 30 carbon atoms).

At least one of $R^2$ or $R^3$ is preferably an electron-withdrawing group. A substituent of which an σp value of Hammett (sigma para value) is positive functions as an electron-withdrawing group.

According to the invention, a substituent having a σp value of Hammett of 0.2 or greater can be exemplified as an electron-withdrawing group. A σp value is preferably 0.25 or greater, more preferably 0.3 or greater, and particularly preferably 0.35 or greater. The upper limit is not particularly limited, but preferably 0.80.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), or an arylsulfonyl group (—SO$_2$Ph: 0.68). Particularly preferably, an example is a cyano group. Here, Me represents a methyl group, and Ph represents a phenyl group.

As a substituent constant σ value of Hammett, for example, paragraphs 0017 and 0018 of JP2011-68731A can be referred to, and the content thereof are incorporated to this specification.

In a case where $R^2$ and $R^3$ are bonded to each other to form a ring, it is preferable to form a 5-membered to 7-membered ring (preferably 5-membered or 6-membered ring). As the formed ring, a ring that is generally used as an acid nucleus in a merocyanine coloring agent is preferable. As specific examples, for example, paragraphs 0019 to 0021 of JP2011-68731A can be referred to, and the contents thereof are incorporated to this specification.

$R^3$ is particularly preferably a heteroaryl group. The heteroaryl group is preferably a 5-membered ring or a 6-membered ring. The heteroaryl group is preferably a single ring or a fused ring, preferably a single ring or a fused ring having a fused number of 2 to 8, and more preferably a single ring or a fused ring having a fused number of 2 to 4. The number of hetero atoms included in a heteroaryl group is preferably 1 to 3 and more preferably 1 to 2. As the hetero atom, a nitrogen atom, an oxygen atom, and a sulfur atom are exemplified. As a heteroaryl group, a quinoline group, a benzothiazole group, and a naphthothiazole group are preferable, and a benzothiazole group is more preferable.

Two $R^2$'s in Formula (1) may be identical to each other or two $R^3$'s may be identical to or different from each other.

In a case where $R^4$'s represent an alkyl group, an aryl group, or a heteroaryl group, the alkyl group, the aryl group, and the heteroaryl group are the same as those described in $R^{1a}$ and $R^{1b}$, and preferable ranges thereof are also the same.

In a case where $R^4$'s represent $-BR^{4A}R^{4B}$, $R^{4A}$ and $R^{4B}$ each independently represent a hydrogen atom or a substituent, and $R^{4A}$ and $R^{4B}$ are bonded to each other to form a ring. Examples of the substituent represented by $R^{4A}$ and $R^{4B}$ include the substituent T described above. A halogen atom, an alkyl group, an alkoxy group, an aryl group, and a heteroaryl group are preferable, an alkyl group, an aryl group, and a heteroaryl group are more preferable, and an aryl group is particularly preferable. Specific examples of the group represented by $-BR^{4A}R^{4B}$ include difluoroboron, diphenylboron, dibutylboron, dinaphthylboron, and catecholboron. Among these, diphenylboron is particularly preferable.

In a case where $R^4$'s represent a metal atom, examples of the metal atom include magnesium, aluminum, calcium, barium, zinc, tin, vanadium, iron, cobalt, nickel, copper, palladium, iridium, and platinum, and particularly preferably aluminum, zinc, vanadium, iron, copper, palladium, iridium, and platinum.

$R^4$'s may form a covalent bond or a coordinate bond with at least one of $R^{1a}$, $R^{1b}$, or $R^3$, and $R^4$ particularly preferably forms a coordinate bond with $R^3$.

$R^4$ is preferably a hydrogen atom or a group represented by $-BR^{4A}R^{4B}$ (particularly, diphenylboron).

Two $R^4$'s in Formula (1) may be identical to or different from each other.

The coloring agent represented by Formula (1) is more preferably a coloring agent represented by Formula (1A) below.

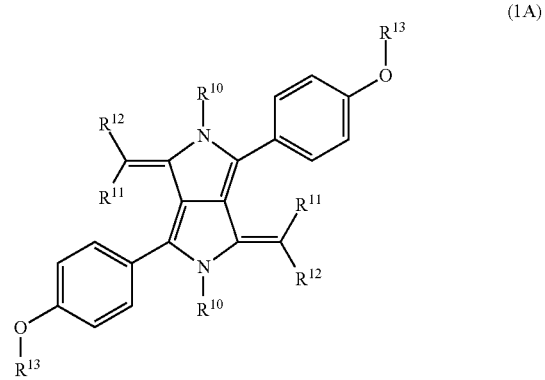

In Formula (1A) above, $R^{10}$'s each independently represent a hydrogen atom, an alkyl group, an aryl group, a heteroaryl group, $-BR^{14A}R^{14B}$ or a metal atom. $R^{10}$ may form a covalent bond or a coordinate bond with $R^{12}$. $R^{11}$ and $R^{12}$ each independently represent a hydrogen atom or a substituent, and at least one of $R^{11}$ or $R^{12}$ is a cyano group, $R^{11}$ and $R^{12}$ may be bonded to each other to form a ring. $R^{13}$'s each independently represent a branched alkyl group having 3 to 30 carbon atoms.

$R^{10}$ is the same as $R^4$ described in Formula (1), and preferable ranges thereof are also the same. A hydrogen atom or a group represented by $-BR^{14A}R^{14B}$ (particularly diphenylboron) is preferable, and a group represented by $-BR^{14A}R^{14B}$ is particularly preferable.

$R^{11}$ and $R^{12}$ are the same as $R^2$ and $R^3$ described in (1) above, and preferable ranges thereof are also the same. It is more preferable that any one of $R^{11}$ and $R^{12}$ is a cyano group, and the other is a heteroaryl group.

$R^{14A}$ and $R^{14B}$ are the same as $R^{4A}$ and $R^{4B}$ described in (1) above, and preferable ranges thereof are also the same.

$R^{13}$'s each independently represent a branched alkyl group having 3 to 30 carbon atoms. The number of carbon atoms of the branched alkyl group is more preferably 3 to 20.

As details of the compound represented by Formula (1), paragraphs 0025 to 0036 of JP2011-68731A (<0043> to <0069> of corresponding US2011/0070407A) can be referred to, and the contents thereof are incorporated to this specification.

As specific examples of the compound represented by Formula (1), for example, paragraphs 0037 to 0052 of JP2011-68731A (<0070> of corresponding US2011/0070407A) can be referred to, and the contents thereof are incorporated to this specification.

According to the invention, in the near-infrared absorption coloring agent, solubility at 25° C. is preferably 1.0 mass % or less and more preferably 0.1 mass % or less with respect to a solvent having a SP value of 25 $(cal/cm^3)^{0.5}$ or less.

The near-infrared absorption coloring agent having the solubility of 1.0 mass % or less at 25° C. with respect to a solvent having a SP value of 25 $(cal/cm^3)^{0.5}$ or less is not dissolved in the solvent and exists in a particle state in the composition. The near-infrared absorption coloring agent in this state has tendency in that dispersibility in the composition is low and thixotropy is easily exhibited. However, according to the invention, with respect to the near-infrared absorption coloring agent like this, it is possible to cause the dispersibility or the thixotropy to be satisfactory. Therefore, the effect of the invention can be prominently exhibited.

The SP value herein is a solubility parameter, extremely great data such as measured values from evaporation latent heat, solubility, or the like and a calculation method by Small, Fedors, or Hansen is suggested. However, according to the invention, a value obtained by a well-known Hoy method is used. Examples of documents of the Hoy method suitably include H. L. Hoy: J. Paint Tech., 42 (540), 76-118 (1970) and "SP value, base, application and calculation method" (Yamamoto, Johokiko Co., Ltd., 2005).

The SP value of the solvent is preferably 23 $(cal/cm^3)^{0.5}$ or less, more preferably 20 $(cal/cm^3)^{0.5}$ or less, even more preferably 18 $(cal/cm^3)^{0.5}$ or less, and still even more preferably 15 $(cal/cm^3)^{0.5}$ or less. For example, the value of the lower limit is preferably 1 $(cal/cm^3)^{0.5}$ or greater, more preferably 3 $(cal/cm^3)^{0.5}$ or greater, and even more preferably 5 $(cal/cm^3)^{0.5}$ or greater.

For example, the SP value of propylene glycol monomethyl ether acetate is 9.2 $(cal/cm^3)^{0.5}$, and the SP value of cyclohexanone is 10.0 $(cal/cm^3)^{0.5}$.

<<Resin Having One or more Selected from Coloring Agent Structure, Heterocyclic Structure, and Acyclic Hetero Atom-containing Group>>

According to the invention, the resin obtained by coating the near-infrared absorption coloring agent has one or more selected from a coloring agent structure, a heterocyclic structure, and an acyclic hetero atom-containing group. The coloring agent structure, the heterocyclic structure, and the acyclic hetero atom-containing group may be provided in the main chain of the resin or may be provided in the side chain. It is preferable that the coloring agent structure, the heterocyclic structure, and the acyclic hetero atom-containing group are provided in the side chain. That is, the resin is preferably a resin having a repeating unit including one or more selected from a coloring agent structure, a heterocyclic structure, and an acyclic hetero atom-containing group.

The coloring agent structure, the heterocyclic structure, and the acyclic hetero atom-containing group each function as a functional group (hereinafter, referred to as a "coloring agent adsorbing group") that adsorbs the near-infrared absorption coloring agent. The coloring agent structure and the heterocyclic structure may be structures having adsorbing properties with respect to the near-infrared absorption coloring agent, and are not particularly limited. That is, the coloring agent structure and the heterocyclic structure may be structures that are identical or similar to the structure of the near-infrared absorption coloring agent or may be different from the structure of the near-infrared absorption coloring agent. The structures may be appropriately selected according to types of near-infrared absorption coloring agents.

Preferably examples of the coloring agent structure include a coloring agent structure derived from a coloring agent selected from a pyrrolopyrrole coloring agent (including a diketo pyrrolopyrrole coloring agent and a pyrrolopyrrole boron coloring agent, and preferably a pyrrolopyrrole boron coloring agent), a quinacridone coloring agent, an anthraquinone coloring agent (including a dianthraquinone coloring agent), a benzoisoindole coloring agent, a thiazine indigo coloring agent, an azo coloring agent, a quinophthalone coloring agent, a phthalocyanine coloring agent, a dioxazine coloring agent, a perylene coloring agent, a perinone coloring agent, a benzimidazolone coloring agent, a benzothiazole coloring agent, a benzimidazole coloring agent, and a benzoxazole coloring agent. A coloring agent structure derived from a coloring agent selected from a pyrrolopyrrole coloring agent, a quinacridone coloring agent, a benzimidazolone coloring agent, a benzothiazole coloring agent, a benzimidazole coloring agent, and a benzoxazole coloring agent is preferable.

Preferable examples of the heterocyclic structure include thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzimidazole, benzothiazole, succinimide, phthalimide, naphthalimide, hydantoin, indole, quinoline, carbazole, acridine, acridone, and anthraquinone. Imidazole, phthalimide, and naphthalimide are preferable.

Examples of the acyclic hetero atom-containing group include a group having a nitrogen atom, and preferable examples thereof include a urea group, an imido group, an amide group, and a sulfonamide group.

Examples of the urea group include $-NR^{100}CONR^{101}R^{102}$. $R^{100}$, $R^{101}$, and $R^{102}$ each independently represent a hydrogen atom, an alkyl group, or an aryl group. The number of carbon atoms in the alkyl group is preferably 1 to 30 and more preferably 1 to 20. The alkyl group may be any one of a linear shape, a branched shape, or a cyclic shape. The number of carbon atoms in an aryl group is preferably 6 to 30 and more preferably 6 to 20. $R^{100}$ and $R^{101}$ each are preferably a hydrogen atom. $R^{102}$ is preferably an alkyl group or an aryl group and more preferably an aryl group.

As a preferable combination between the near-infrared absorption coloring agent and the coloring agent adsorbing group of the resin, for example, in a case where the near-infrared absorption coloring agent is a pyrrolopyrrole coloring agent (preferably, a compound represented by Formula (1) described above), the coloring agent adsorbing group of the resin is preferably a coloring agent structure derived from a coloring agent selected from a pyrrolopyrrole coloring agent, a benzimidazolone coloring agent, a benzothiazole coloring agent, a benzimidazole coloring agent, and a benzoxazole coloring agent, a heterocyclic structure having the same structure as the substituent included in a pyrrolopyrrole coloring agent skeleton, or an acyclic hetero atom-containing group.

For example, in a case where the near-infrared absorption coloring agent is a phthalocyanine coloring agent, the coloring agent adsorbing group of the resin is preferably a perylene coloring agent, a coloring agent structure having high leveling such as anthraquinone, a heterocyclic structure having the same structure as the substituent included in the phthalocyanine coloring agent skeleton, or an acyclic hetero atom-containing group.

According to this aspect, the resin can be strongly adsorbs in the near-infrared absorption coloring agent (pyrrolopyrrole coloring agent).

The resin can be synthesized by using a monomer having a coloring agent structure, a heterocyclic structure, or an acyclic hetero atom-containing group. For example, examples of a raw material monomer include monomers in the following structures.

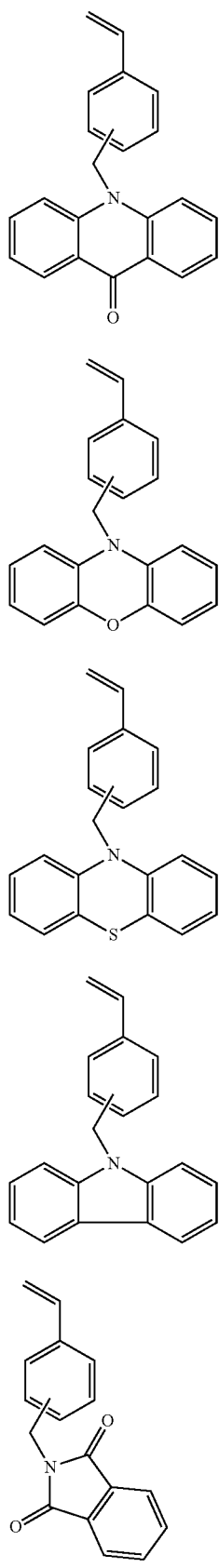
M-1
M-2
M-3
M-4
M-5
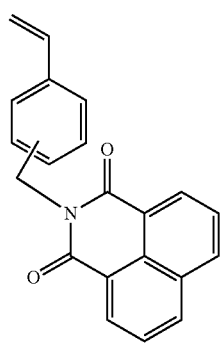
M-6
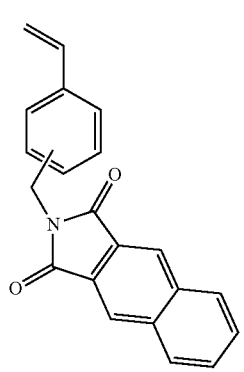
M-7
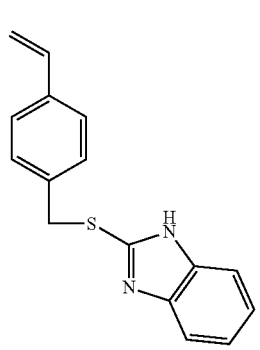
M-8
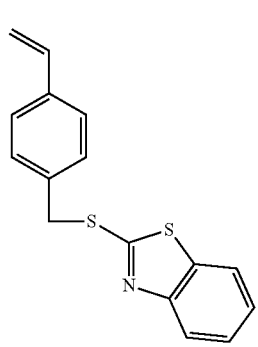
M-9

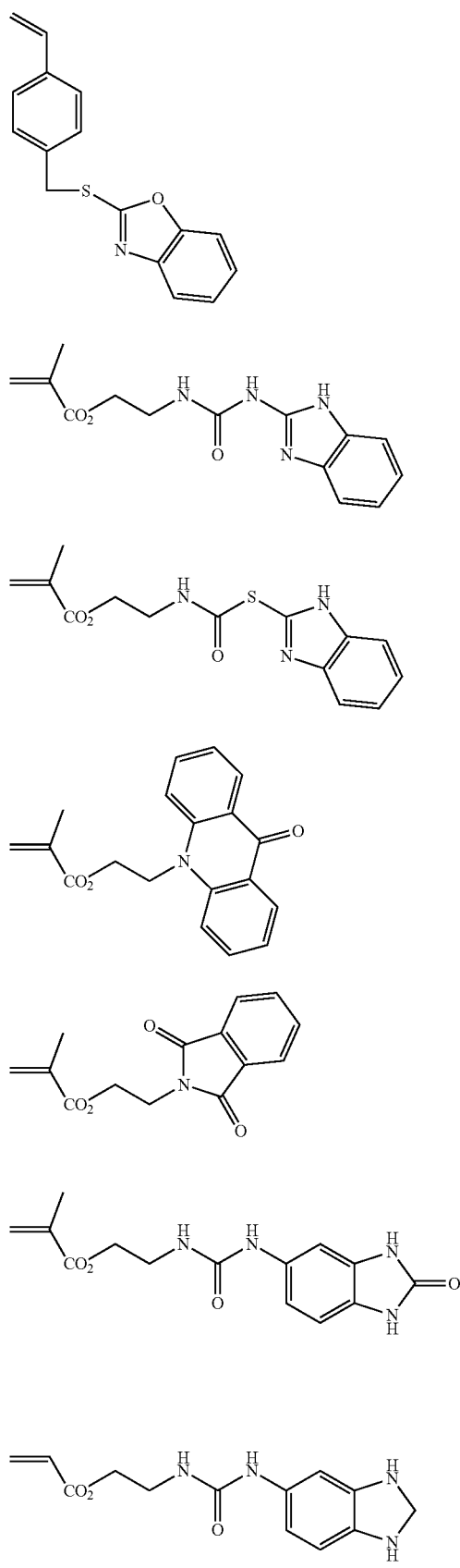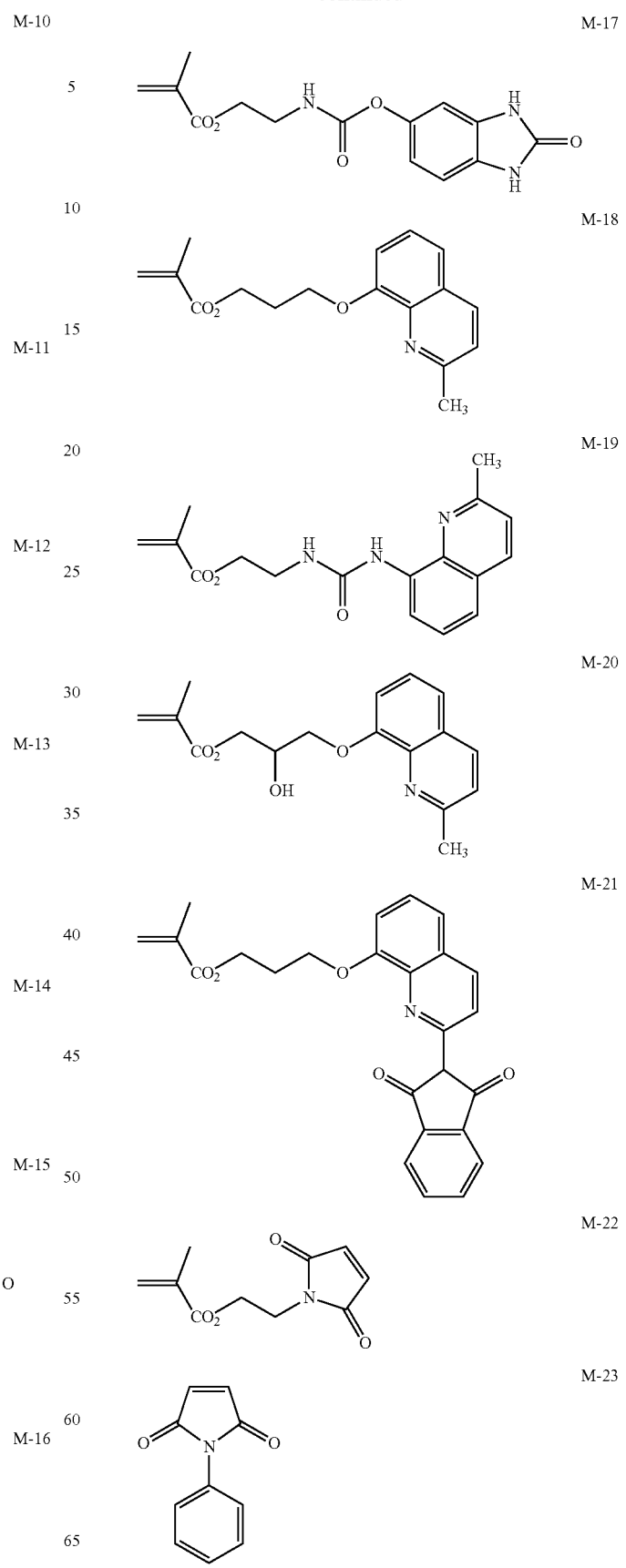

M-24
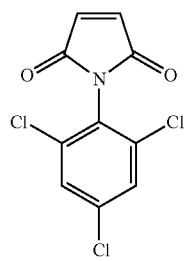
M-25
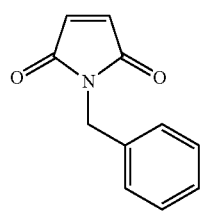
M-26
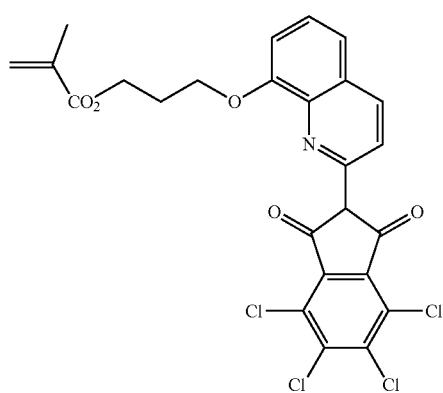
(M-27)
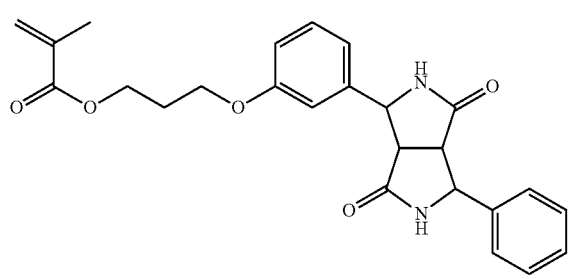
(M-28)
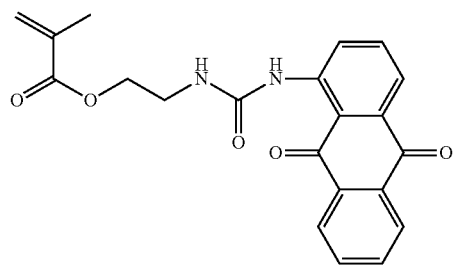
(M-29)
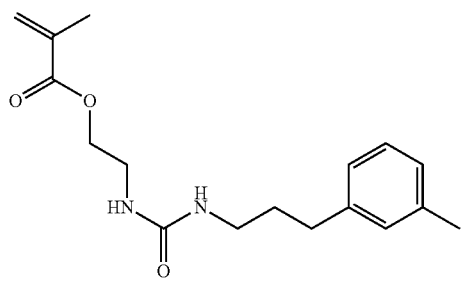
(M-30)
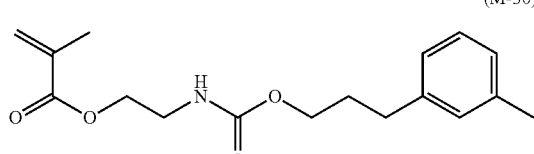
(M-31)
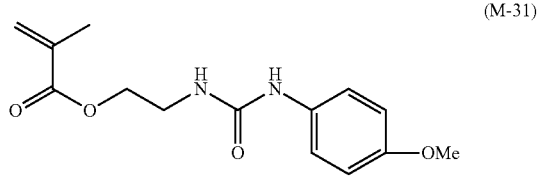
(M-32)
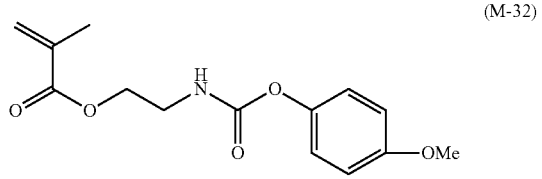
(M-33)
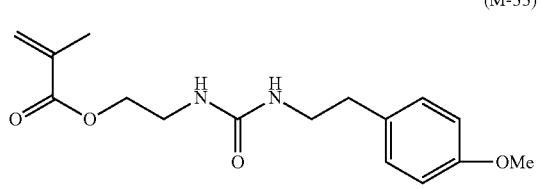
(M-34)
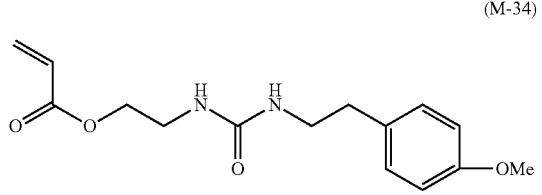
(M-35)
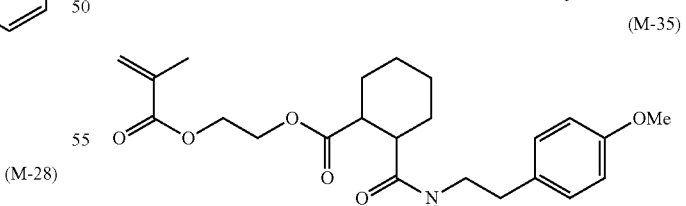
(M-36)
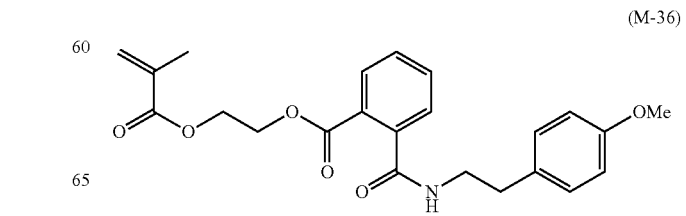

(M-37)
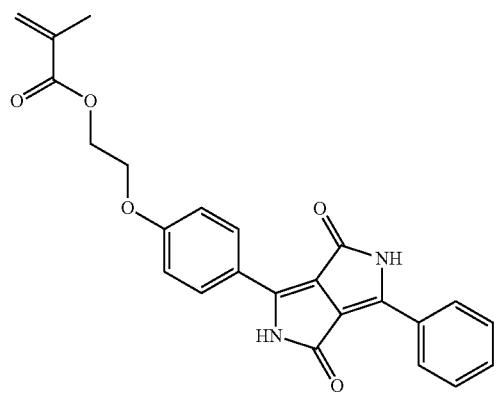

(M-38)
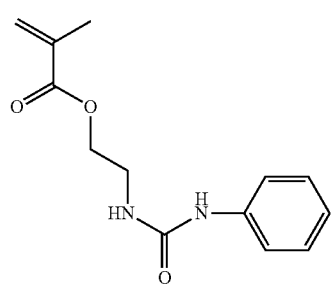

(M-39)
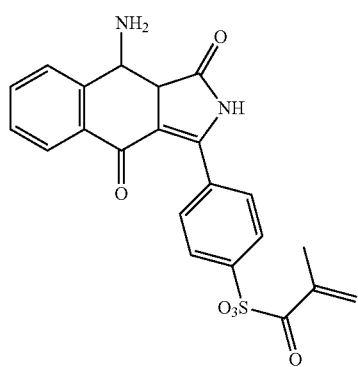

(M-40)
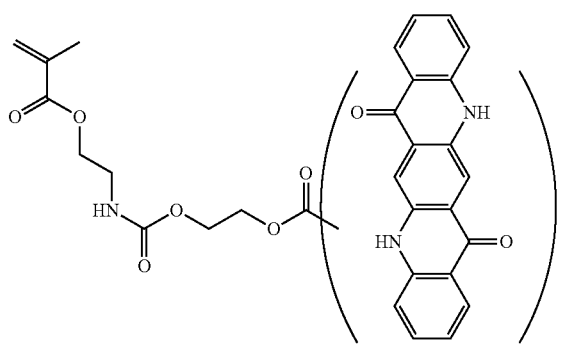

(M-41)
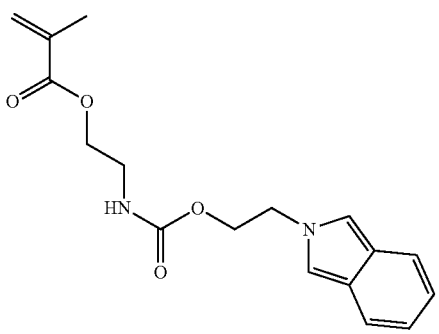

(M-42)
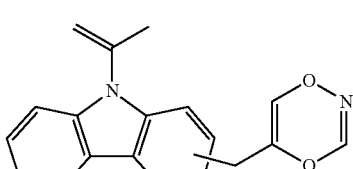

(M-43)
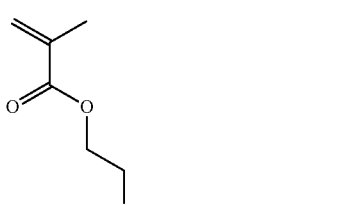

(M-44)
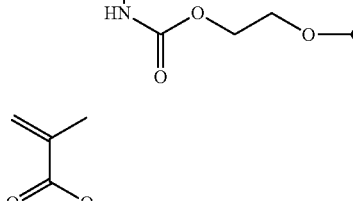

The resin used in the invention may include any one of a coloring agent structure, a heterocyclic structure, and an acyclic hetero atom-containing group singly, or may include two or more types thereof. In a case where two or more types thereof are included, two or more types of coloring agent structures only, two or more types of heterocyclic structures only, or two or more types of acyclic hetero atom-containing groups only may be included. Otherwise, one or more types of the coloring agent structure and the heterocyclic structure respectively, one or more types of the coloring agent structure and the acyclic hetero atom-containing group respectively, or one or more types of the heterocyclic structure and the acyclic hetero atom-containing group respectively may be included.

With respect to the resin used in the invention, for example, the ratio of the repeating unit having one or more selected from the coloring agent structure, the heterocyclic structure, and the acyclic hetero atom-containing group is preferably 0.1 to 90 mol with respect to 100 mol of the total repeating unit of the resin. The lower limit is more preferably 1 mol or greater and even more preferably 2 mol or greater. The upper limit is more preferably 80 mol or less and even more preferably 70 mol or less.

The resin used in the invention may include repeating units other than the repeating unit including one or more types selected from the coloring agent structure, the heterocyclic structure, and the acyclic hetero atom-containing group. The other repeating units may include functional groups such as an acid group. The other repeating units may not include a functional group.

Examples of the acid group include a carboxyl group, a sulfonic acid group, and a phosphoric acid group. Only one type of the acid group may be included or two or more types thereof may be included.

Examples of the other functional groups include a group consisting of repetition of 2 to 20 unsubstituted alkyleneoxy chains, lactone, acid anhydride, an amide group, a cyano group, an alkyl group, an aralkyl group, an aryl group, a polyalkylene oxide group, a hydroxyl group, a maleimide group, and an amino group, and the other functional groups can be appropriately introduced.

In the group consisting of repetition of 2 to 20 unsubstituted alkyleneoxy chains, the number of repetition of the alkyleneoxy chains is preferably 2 to 20, more preferably 2 to 15, and even more preferably 2 to 10. One alkyleneoxy chain is represented by $-(CH_2)_nO-$, n is an integer, and n is preferably 1 to 10, more preferably 1 to 5, and even more preferably 2 or 3.

Other repeating units may be a graft-type repeating unit obtained by copolymerizing a macromonomer. That is, the resin may be a graft copolymer.

Examples of the macromonomers include macromonomers AA-6 (polymethyl methacrylate of which a terminal group is a methacryloyl group), AS-6 (polystyrene of which a terminal group is a methacryloyl group), AN-6S (a copolymer of styrene and acrylonitrile of which a terminal group is a methacryloyl group), and AB-6 (polybutyl acrylate of which a terminal group is end group is a methacryloyl group) manufactured by Toagosei Co., Ltd., PLACCEL FM5 (a 5 molar equivalent ε-caprolactone adduct of 2-hydroxyethyl methacrylate), FA10L (a 10 molar equivalent ε-caprolactone adduct of 2-hydroxyethyl acrylate) manufactured by Daicel Corporation, and a polyester-based macromonomer disclosed in JP1990-272009A (JP-H02-272009A).

In a case where the resin used in the invention includes a repeating unit having an acid group, for example, the ratio of the repeating unit having an acid group is preferably 0 to 90 mol with respect to 100 mol of the total repeating unit of the resin. The lower limit is more preferably 10 mol or greater and even more preferably 20 mol or greater. The upper limit is more preferably 80 mol or less and even more preferably 70 mol or less.

Specific examples of the other repeating units are provided, but the invention is not limited thereto.

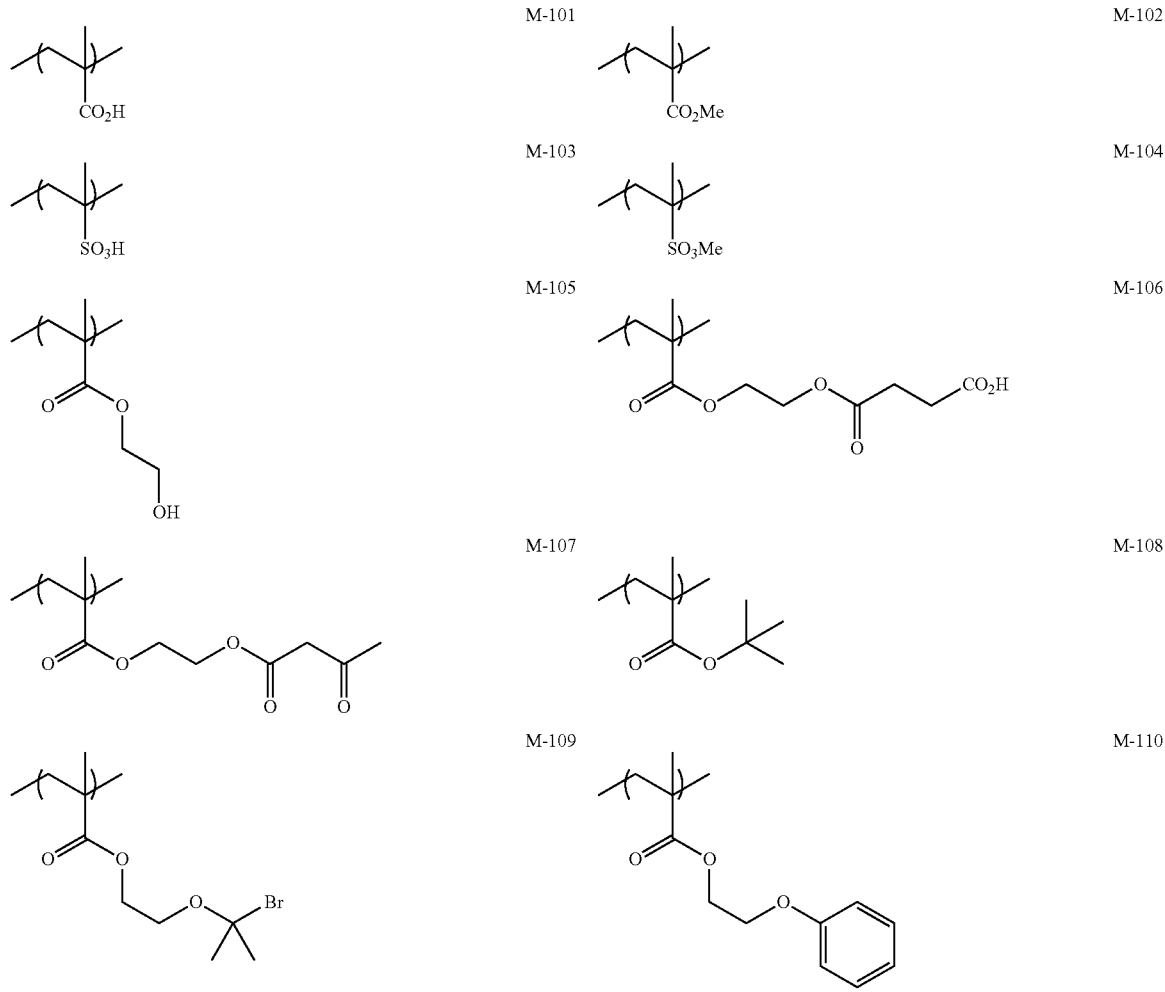

-continued
M-111 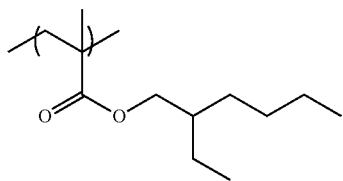 M-112 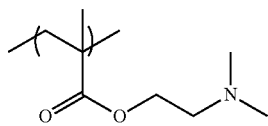
M-113 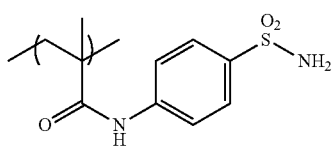 M-114 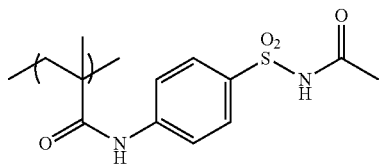
M-115 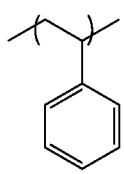 M-116 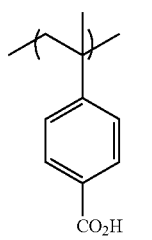
M-117 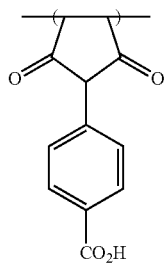 M-118 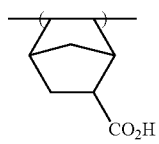
M-119 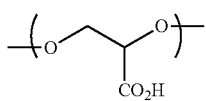 M-120 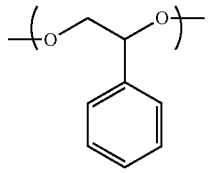
M-121 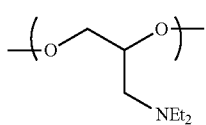 M-123 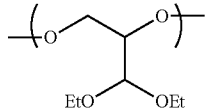
M-124 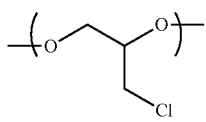 M-125 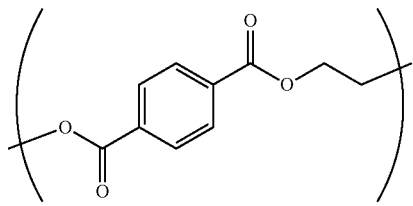
M-126 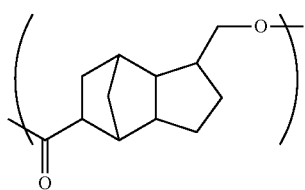 M-127 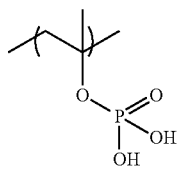

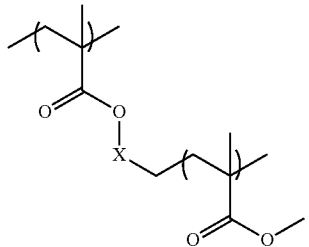

M-128

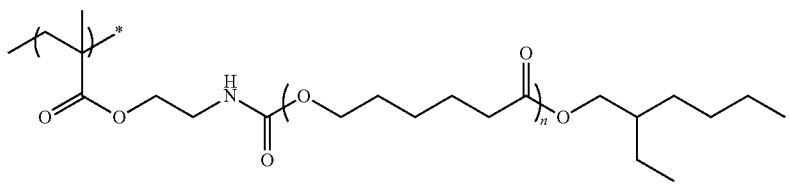

n = 1-30

M-128 is a macromonomer AA-6 manufactured by Toagosei Co., Ltd.

The resin used in the invention preferably includes one or more selected from a (meth)acryl resin, a styrene resin, a (meth)acrylic/styrene resin, a urethane resin, an imide resin, a urea resin, an epoxy resin, and an ester resin and more preferably includes one or more selected from a (meth)acryl resin, a styrene resin, and a (meth)acrylic/styrene resin.

In this specification, a (meth)acrylic/styrene resin means a resin containing a (meth)acrylic resin and a styrene resin as main components. If a (meth)acrylic resin and a styrene resin are contained as main components, a total content of a (meth)acrylic resin and a styrene resin is preferably 50 mass % or greater, more preferably 60 mass % or greater, and particularly preferably 70 mass % or greater in the (meth) acrylic/styrene resin.

With respect to the resin used in the invention, an acid value is preferably less than 200 mgKOH/g, more preferably 190 mgKOH/g or less, and even more preferably 180 mgKOH/g or less. The lower limit is preferably 0 mgKOH/g or greater, more preferably 10 mgKOH/g or greater, and even more preferably 20 mgKOH/g or greater. If the acid value of the resin is less than 200 mgKOH/g, the aggregation between acid groups of the resin can be suppressed, and dispersibility and thixotropy of the near-infrared absorption coloring agent can be improved.

The weight-average molecular weight of the resin is preferably 2,000 to 200,000. For example, the lower limit is more preferably 2,000 or greater and even more preferably 3,000 or greater. For example, the upper limit is more preferably 100,000 or less and even more preferably 80,000 or less. If the weight-average molecular weight of the resin is in the range described above, the resin can be strongly adsorbs in the near-infrared absorption coloring agent, and dispersibility and thixotropy of the near-infrared absorption coloring agent can be further improved.

As specific examples of the resin used in the invention, the following can be provided. These can be used singly or two or more types thereof can be used.

(B-2)

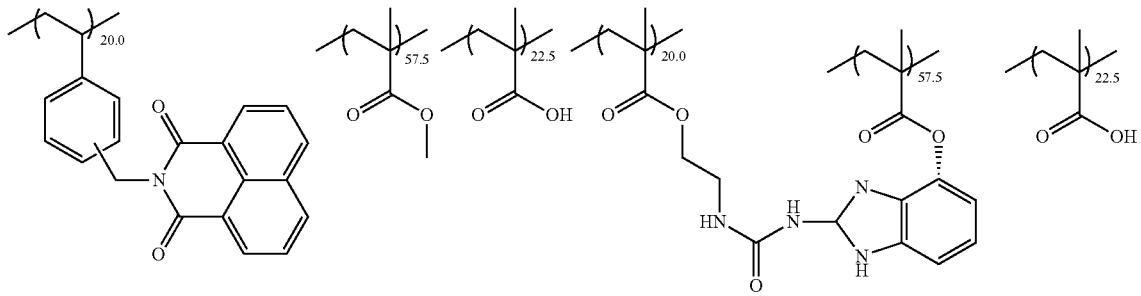

(B-3)
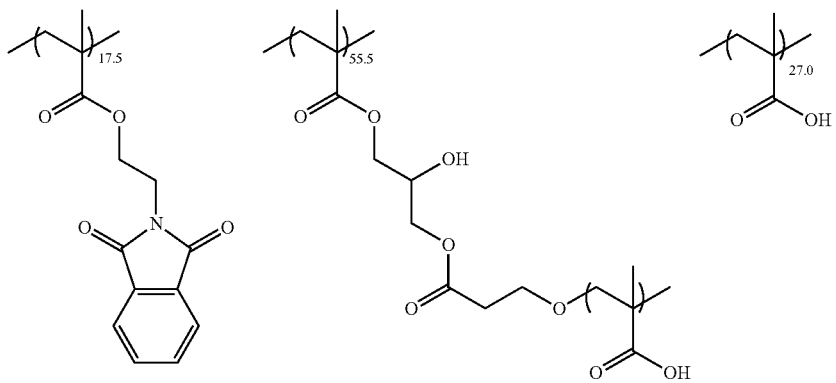
(B-4)
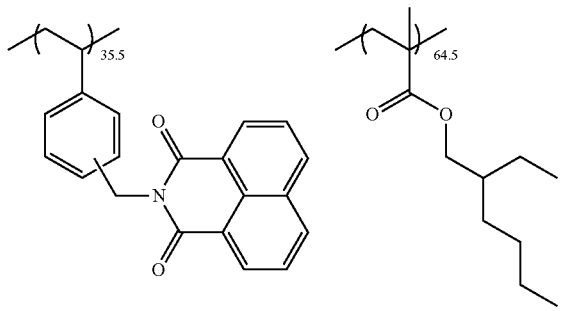
(B-5)
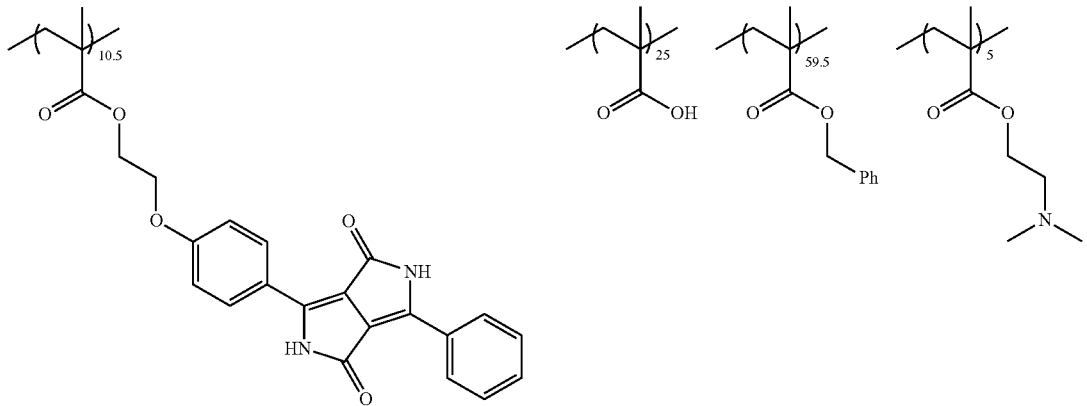
(B-6)
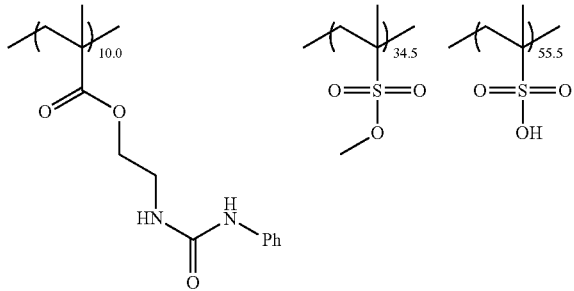

-continued
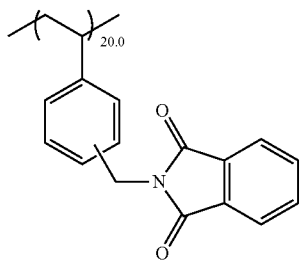 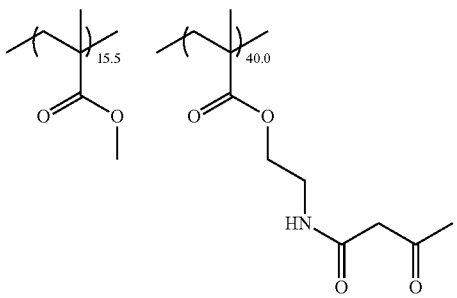 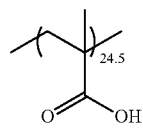
(B-7)
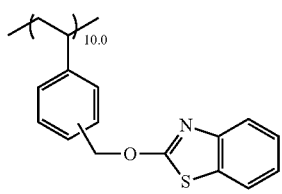 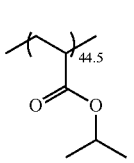 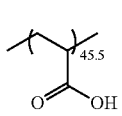 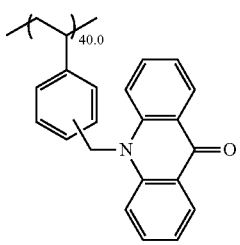 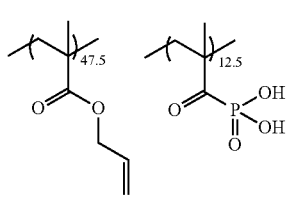
(B-8) (B-9)
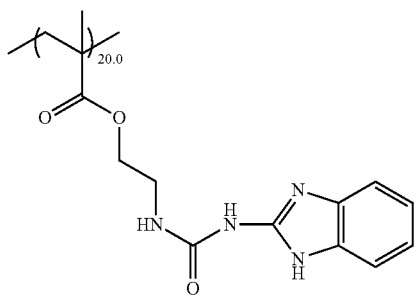 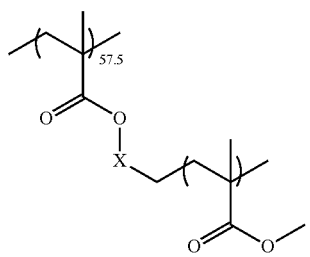 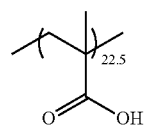
(B-10)
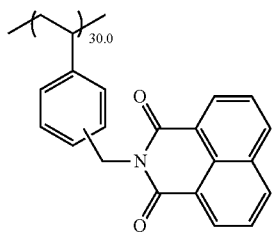 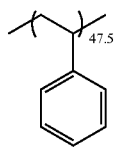 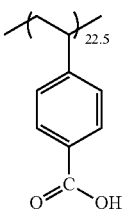 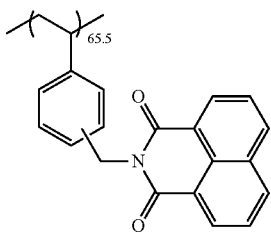 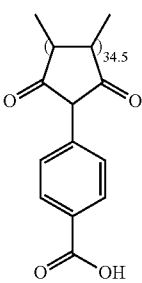
(B-11) (B-12)
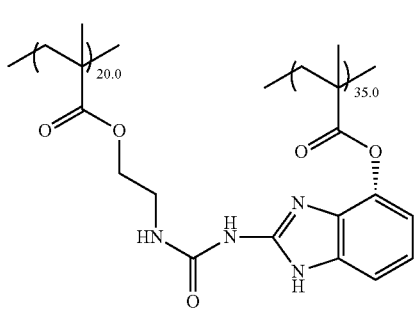 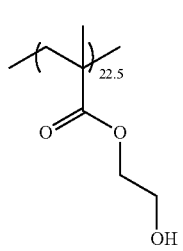 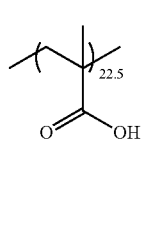
(B-13)

(B-14)
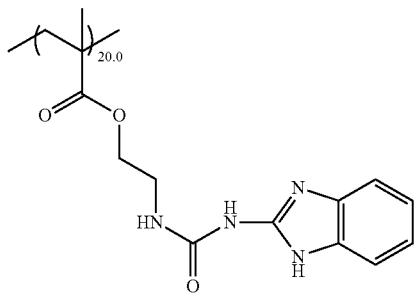 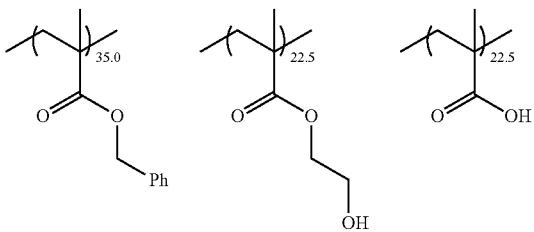
(B-15)
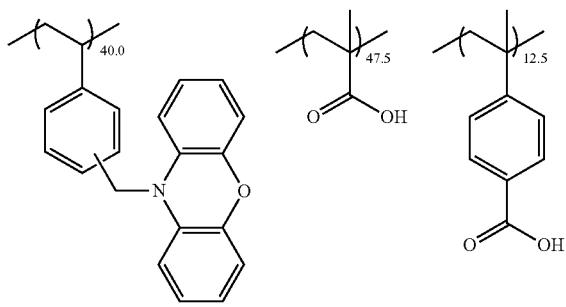
(B-16)
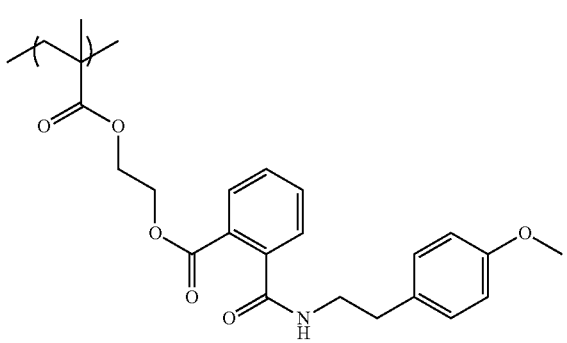
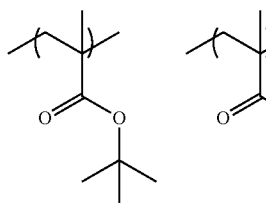
(B-17)
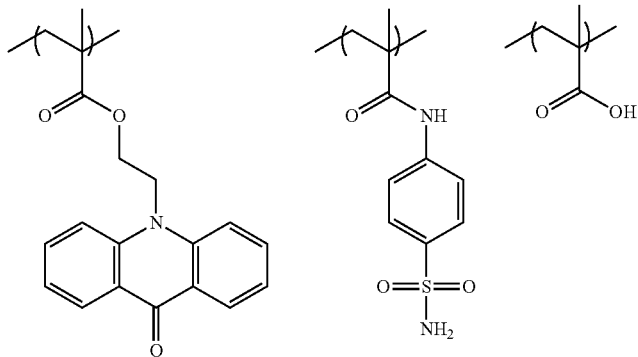

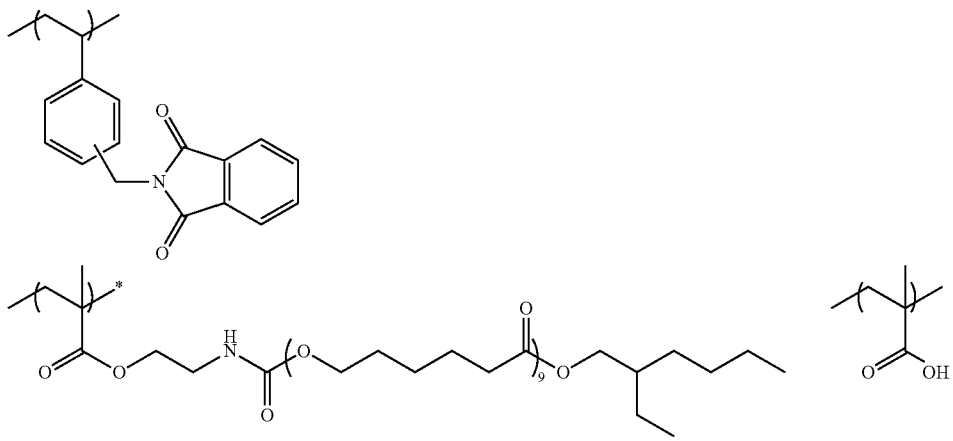

(B-18)

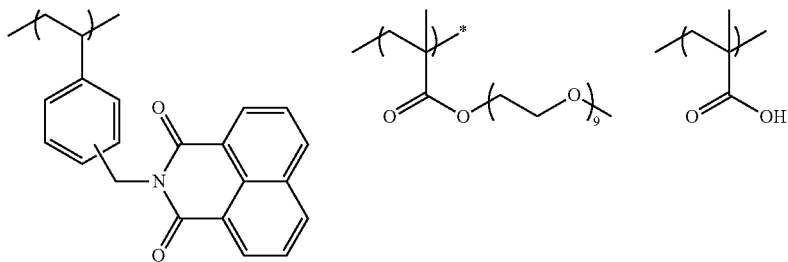

(B-19)

B-10 is a resin including a repeating unit derived from a macromonomer AA-6 manufactured by manufactured by Toagosei Co., Ltd. as the other repeating units.

The resin can be synthesized, for example, by a method disclosed in paragraph numbers 0061 to 0063 of JP2009-149849A. The contents thereof are included in this specification.

<<Method of Manufacturing Processed Coloring Agent>>

The processed coloring agent according to the invention can be manufactured by performing a pulverizing treatment on the near-infrared absorption coloring agent, in presence of the resin having one or more selected from a coloring agent structure, a heterocyclic structure, and an acyclic hetero atom-containing group. For example, the pulverizing treatment can be manufactured by using a pulverizer such as a beads mill or a roll mill, grinding the near-infrared absorption coloring agent, and performing mixture and dispersion.

The amount used of the resin in the pulverizing process is preferably 1 to 200 parts by mass with respect to 100 parts by mass of the near-infrared absorption coloring agent. For example, the lower limit is more preferably 5 parts by mass or greater and even more preferably 10 parts by mass or greater. For example, the upper limit more preferably 100 parts by mass or less and even more preferably 60 parts by mass or less.

The pulverizing treatment of the near-infrared absorption coloring agent may be performed by further adding a solvent and/or water-soluble inorganic salts.

Examples of the solvent include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, and propylene glycol monomethyl ether acetate.

The amount used of the solvent in the pulverizing process is preferably 50 to 300 parts by mass with respect to 100 parts by mass of the near-infrared absorption coloring agent. For example, the lower limit is more preferably 75 parts by mass or greater and even more preferably 100 parts by mass or greater. For example, the upper limit is more preferably 250 parts by mass or less and even more preferably 200 parts by mass or less. The solvent may be used singly or two or more types thereof may be used in a mixture, if necessary.

Examples of water-soluble inorganic salts include sodium chloride, potassium chloride, calcium chloride, barium chloride, and sodium sulfate.

The amount used of water-soluble inorganic salts in the pulverizing process is preferably 100 to 5,000 parts by mass with respect to 100 parts by mass of the near-infrared absorption coloring agent. For example, the lower limit is more preferably 75 parts by mass or greater and even more preferably 100 parts by mass or greater. For example, the upper limit is more preferably 2,500 parts by mass or less and even more preferably 1,000 parts by mass or less.

The pulverizing treatment of the near-infrared absorption coloring agent is preferably performed such that an average primary particle diameter of the obtained processed coloring agent is 200 nm or less. For example, the upper limit is preferably 200 nm or less and more preferably 100 nm or less. The lower limit is preferably 1 nm or greater and more preferably 2 nm or greater. If the average primary particle is in this range, the effect in that dispersion can be performed without aggregation between processed coloring agents can be exhibited.

After the pulverizing treatment of the near-infrared absorption coloring agent, filtration and washing is performed, a solvent and water-soluble inorganic salts are removed, and drying is performed so as to obtain the processed coloring agent.

In the near-infrared absorption composition according to the invention, the content of the processed coloring agent is preferably 0.1 to 80 mass % with respect to a total solid content of the near-infrared absorption composition. For example, the lower limit is more preferably 1 mass % or greater and even more preferably 5 mass % or greater. For example, the upper limit is more preferably 60 mass % or less and even more preferably 50 mass % or less. The processed coloring agent can be used singly or two or more types thereof may be used in combination. In a case where two or more types of processed coloring agents are included, the sum thereof is preferably in the range described above.

With respect to the near-infrared absorption composition according to the invention, for example, a ratio of the processed coloring agent in the total amount of the coloring agent is preferably 50 to 100 mass %. The lower limit is more preferably 60 mass % or greater and even more preferably 70 mass % or greater. The upper limit may be 95 mass % or less and may be 90 mass % or less.

In the near-infrared absorption composition according to the invention, the average secondary particle diameter of the processed coloring agent is preferably 1,000 nm or less. The upper limit is preferably 800 nm or less and more preferably 500 nm or less. The lower limit is preferably 10 nm or greater and more preferably 20 nm or greater. If the average secondary particle is in this range, it is possible to obtain the composition having satisfactory dispersibility.

In this specification, the average secondary particle diameter means an average particle diameter with respect to secondary particles obtained by aggregating primary particles (single fine crystal) of the processed coloring agent. The average secondary particle diameter is a value obtained by measurement based on the volume by using MICROTRACUPA 150 manufactured by Nikkiso Co., Ltd.

With respect to the near-infrared absorption composition according to the invention, the viscosity in 50 (l/s) at 25° C. is preferably 100 mPa·s or less, more preferably 50 mPa·s or less and even more preferably 20 mPa·s or less. For example, the lower limit is preferably 0.1 mPa·s or greater, more preferably 0.5 mPa·s or greater, and even more preferably 1 mPa·s or greater.

With respect to the composition according to the invention, the Ti value which is a ratio of viscosity in 20 (l/s) and viscosity in 50 (l/s) at 25° C. is preferably 2.0 or less, more preferably 1.5 or less, and even more preferably less than 1.1. The Ti value is defined as follows.

Ti value=viscosity in 20 (l/s)/viscosity in 50 (l/s)

Hereinafter, the respective components other than the processed coloring agent of the near-infrared absorption composition according to the invention are described.

<<Other Coloring Agent>>

The near-infrared absorption composition according to the invention may further include coloring agents (hereinafter, also referred to as other coloring agents) other than the processed coloring agent. Examples of the other coloring agents include a compound (hereinafter, also referred to as a colorant) having a maximum absorption wavelength in a wavelength range of 400 to 700 nm and a compound (hereinafter, also referred to as other near-infrared absorption compounds) having a maximum absorption wavelength in a near-infrared range.

<<<Colorant>>>

The colorant may be a pigment or may be a dye. Examples of the pigment include various inorganic pigments or various organic pigments well-known in the art.

Examples of the organic pigment include below. However, the invention is not limited thereto.

C. I. pigment yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. pigment orange 2, 5, 13, 16, 17:1, 31, 34, 36, 38, 43, 46, 48, 49, 51, 52, 55, 59, 60, 61, 62, 64, 71, 73, and the like, C. I. pigment red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. pigment green 7, 10, 36, 37, and 58, C. I. pigment violet 1, 19, 23, 27, 32, 37, and 42, and C. I. pigment blue 1, 2, 15, 15:1, 15:2, 15:3, 15:4, 15:6, 16, 22, 60, 64, 66, 79, and 80.

Examples of the inorganic pigment include metal oxide such as iron, cobalt, aluminum, cadmium, lead, copper, titanium, magnesium, chromium, zinc, and antimony, and composite oxide of metal described above.

As the dye, for example, coloring agents disclosed in JP1989-90403A (JP-S64-90403A), JP1989-91102A (JP-S64-91102A), JP1989-94301A (JP-H01-94301A), JP1994-11614A (JP-H06-11614A), JP2592207B, U.S. Pat. Nos. 4,808,501A, 5,667,920A, US505950A, JP1993-333207A (JP-H05-333207A), JP1994-35183A (JP-H06-35183A), JP1994-51115A (JP-H06-51115A), JP1994-194828A (JP-H06-194828A), and the like can be used. If the dye is classified into chemical structure, a pyrazole azo compound, a pyrromethene compound, an anilinoazo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like can be used. As the dye, coloring agent multimers may be used. Examples of the coloring agent multimer include compounds include JP2011-213925A and JP2013-041097A.

<<<Other Near-infrared Absorption Compound>>>

Examples of the other near-infrared absorption compounds include compounds described in the near-infrared absorption coloring agent described above. A copper compound can be used. As the copper compound, copper compounds disclosed in paragraph numbers 0013 to 0056 of JP2014-41318A and paragraph numbers 0012 to 0030 of JP2014-32380A may be used, and the contents thereof may be incorporated to this specification. Near-infrared absorption particles consisting of crystallites of oxide including compounds disclosed in paragraphs 0004 to 0016 of JP1995-164729A (JP-H07-164729A), compounds disclosed in paragraphs 0027 to 0062 of JP2002-146254A, and Cu and/or P disclosed in paragraphs 0034 to 0067 of JP2011-164583A and having a number average aggregation particle diameter of 5 to 200 nm may be used, and the contents thereof are incorporated to this specification.

<<Coloring Agent Derivative>>

It is preferable that the near-infrared absorption composition according to the invention further includes a coloring agent derivative. If the composition includes a coloring agent derivative, dispersibility of the processed coloring agent in the composition increases, aggregation of the processed coloring agent can be effectively suppressed. Thixotropy can be also increased. The coloring agent derivative is preferably a pigment derivative.

The coloring agent derivative is specifically a compound in which an organic coloring agent is used as a skeleton of a parent body and an acid group, a basic group, or an aromatic group is introduced to a side chain, as a substituent. Specific examples of the organic coloring agent include a quinacridone-based coloring agent, a phthalocyanine-based coloring agent, an azo-based coloring agent, a quinophthalone-based coloring agent, an isoindoline-based coloring agent, an isoindolinone-based coloring agent, a quinoline-based coloring agent, a diketo pyrrolopyrrole-based coloring agent, and a benzimidazolone-based coloring agent. Generally, pale yellow aromatic polycyclic compounds such as a naphthalene-based compound, an anthraquinone-based compound, a triazine-based compound, and a quinoline-based compound which are not described as the coloring agent are also included.

As the coloring agent derivative, compounds disclosed in JP1999-49974A (JP-H11-49974A), JP1999-189732A (JP-H11-189732A), JP1998-245501A (JP-H10-245501A), JP2006-265528A, JP1996-295810A (JP-H08-295810A), JP1999-199796A (JP-H11-199796A), JP2005-234478A, JP2003-240938A, and JP2001-356210A can be used.

The near-infrared absorption composition according to the invention preferably contains a coloring agent derivative by 0.1 to 30 parts by mass with respect to 100 parts by mass of the processed coloring agent. The lower limit value is preferably 1 parts by mass or greater and more preferably 2 parts by mass or greater. The upper limit value is preferably 20 parts by mass or less and more preferably 15 parts by mass or less. If the content of the coloring agent derivative is in the range described above, dispersibility and thixotropy of the processed coloring agent can be further improved.

The coloring agent derivative may be used singly or two or more types thereof can be used. In a case where two or more types the coloring agent derivative are used, the total amount is preferably in the range described above.

<<Organic Solvent>>

It is preferable that the near-infrared absorption composition according to the invention further includes an organic solvent.

The organic solvent is not particularly limited and can be appropriately selected depending on the purpose, as long as the organic solvent can be evenly dissolved and dispersed. Examples thereof suitably include alcohols, ketones, esters, aromatic hydrocarbons, halogenated hydrocarbons, dimethylformamide, dimethylacetamide, dimethyl sulfoxide, and sulfolane. These may be used singly or two or more types may be used in combination.

Specific examples of alcohols, aromatic hydrocarbons, and halogenated hydrocarbons include those disclosed in paragraph 0136 of JP2012-194534A and the like, and the contents thereof are incorporated to this specification.

Specific examples of esters, ketones, and ethers include paragraph 0497 of JP2012-208494A (<0609> of corresponding US2012/0235099A). Examples thereof include n-amyl acetate, ethyl propionate, dimethyl phthalate, ethyl benzoate, methyl sulfate, acetone, methyl isobutyl ketone, diethyl ether, and ethylene glycol monobutyl ether acetate.

As the organic solvent, one or more selected from cyclopentanone, cyclohexanone, propylene glycol monomethyl ether acetate, N-methyl-2-pyrrolidone, butyl acetate, ethanol, ethyl lactate, and propylene glycol monomethyl ether is preferable.

The content of the organic solvent is preferably a value in which a total solid content of the near-infrared absorption composition according to the invention becomes 5 to 60 mass %, and more preferably a value in which a total solid content of the composition according to the invention becomes 10 to 40 mass %.

The organic solvent may be used singly or two or more types thereof may be used in combination. In a case where two or more types of organic solvents are used, it is preferable that the total amount becomes the range described above.

<<Resin>>

It is preferable that the near-infrared absorption composition according to the invention further includes a resin. For example, the resin is formulated as a dispersing agent for dispersing the processed coloring agent in the composition.

The resin that works as a dispersing agent is preferably an acidic type resin and/or a basic type resin and more preferably an acidic type resin.

Here, an acidic type resin represents a resin in which an amount of acid groups is greater than an amount of basic groups. In the acidic type resin, it is preferable that an amount of acid groups is 70 mol % or greater when a total amount of a value of an acid and a value of a basic group in the resin is 100 mol %, and it is more preferable that the resin substantially consists of only with acid groups. The acid group included in the acidic type resin is preferably a carboxyl group. The acid value of the acidic type resin is preferably 40 to 105 mgKOH/g, more preferably 50 to 105 mgKOH/g, and even more preferably 60 to 105 mgKOH/g.

A basic type resin represents a resin in which an amount of basic groups is greater than an amount of acid groups. In the basic type resin, it is preferable that an amount of basic groups is 50 mol % or greater, when a total amount of an amount of acid groups and an amount of basic groups in the resin is 100 mol %. A basic group included in the basic type resin is preferably amine.

The polymer dispersant can be further classified into a linear polymer, a terminal modification-type polymer, a graft-type polymer, and a block-type polymer.

Examples of the terminal modification-type polymer include polymers having phosphoric acid groups at terminals disclosed in JP1991-112992A (JP-H03-112992A) and JP2003-533455A, polymers having sulfonic acid groups at terminals disclosed in JP2002-273191A, and polymers having a partial skeleton and a heterocyclic ring of an organic coloring agent disclosed in JP1997-77994A (JP-H09-77994A). Polymers obtained by introducing anchor parts (partial skeletons or heterocyclic rings of an acid group, a basic group, or an organic coloring agent, and the like) to two or more pigment surfaces to polymer terminals of JP2007-277514A have excellent dispersion stability and thus are preferable.

Examples of a graft-type polymer include reaction products of poly(lower alkylene imine) and polyester disclosed in JP1979-37082A (JP-S54-37082A), JP1996-507960A (JP-H08-507960A), and JP2009-258668A, reaction products of polyallylamine and polyester disclosed in JP1997-169821A (JP-H09-169821A), copolymers of macromonomers and nitrogen atom monomers disclosed in JP1998-339949A (JP-H10-339949A) and JP2004-37986A, graft-type polymers having heterocyclic rings and partial skeletons of organic coloring agents disclosed in JP2003-238837A and JP2008-9426A, and JP2008-81732A, and copolymers of macromonomers and acid group-containing monomers disclosed in JP2010-106268A.

As the block-type polymer, block-type polymers disclosed in JP2003-49110A and JP2009-52010A are preferable.

The resin can use a graft copolymer including a repeating unit represented by any one of Formulae (1) to (4).

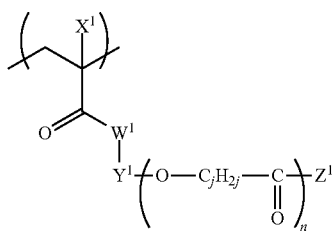

(1)

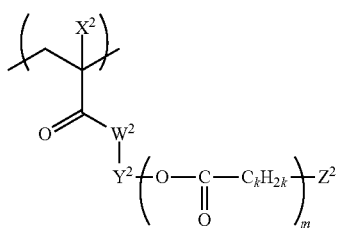

(2)

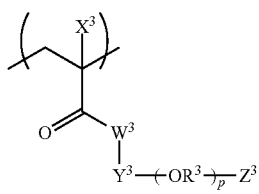

(3)

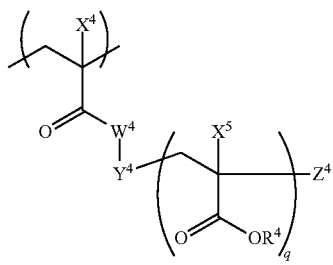

(4)

$X^1$, $X^2$, $X^3$, $X^4$, and $X^5$ each independently represent a hydrogen atom or a monovalent organic group. A hydrogen atom or an alkyl group having 1 to 12 carbon atoms is preferable, a hydrogen atom or a methyl group is more preferable, and a methyl group is particularly preferable.

$W^1$, $W^2$, $W^3$, and $W^4$ each independently represent an oxygen atom or NH, and an oxygen atom is preferable.

$R^3$ represents a branched or linear alkylene group (preferably having 1 to 10 carbon atoms or more preferably 2 or 3 carbon atoms). In view of dispersion stability, a group represented by —$CH_2$—$CH(CH_3)$— or a group represented by —$CH(CH_3)$—$CH_2$— is preferable.

$Y^1$, $Y^2$, $Y^3$ and $Y^4$ each independently represent a divalent linking group.

$Z^1$, $Z^2$, $Z^3$, and $Z^4$ each independently represent a hydrogen atom or a monovalent substituent.

With respect to the graft copolymer, disclosure in paragraph numbers 0025 to 0069 of JP2012-255128A are referred to, and the contents above are incorporated to this specification.

Specific examples of the graft copolymer includes below. Resins disclosed in paragraph numbers 0072 to 0094 of JP2012-255128A can be used.

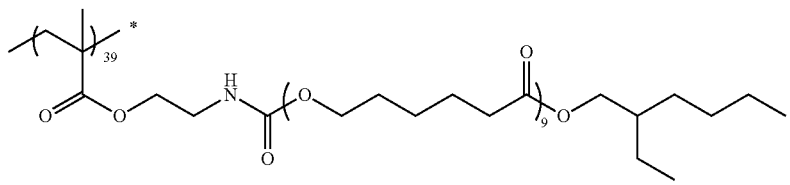

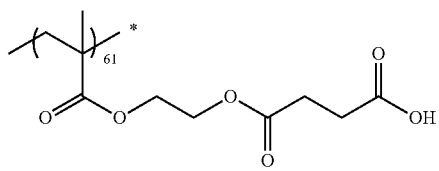

The resin can use an oligoimine-based resin including a nitrogen atom on at least one of a main chain or a side chain. As the oligoimine-based resin, a resin that has a repeating unit having a partial structure X having a functional group with pKa of 14 or less and a side chain including a side chain Y having 40 to 10,000 atoms and has a basic nitrogen atom one or more of main chain and a side chain is preferable. The basic nitrogen atom is not particularly limited, as long as the basic nitrogen atom is a nitrogen atom exhibiting basicity.

Examples of the oligoimine-based resin include a resin that includes a repeating unit represented by Formula (I-1), a repeating unit represented by Formula (I-2), and/or a repeating unit represented by Formula (I-2a).

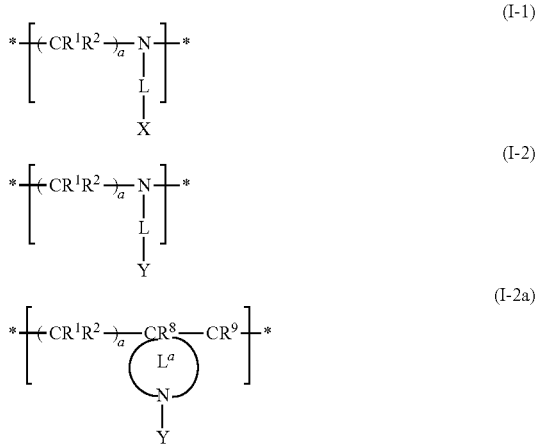

$R^1$ and $R^2$ each independently represent a hydrogen atom, a halogen atom, or an alkyl group (preferably having 1 to 6 carbon atoms). a each independently represent an integer of 1 to 5. * represents a linking portion between repeating units.

$R^8$ and $R^9$ are the same as $R^1$.

L is a single bond or a linking group relating to an alkylene group (preferably having 1 to 6 carbon atoms), an alkenylene group (preferably having 2 to 6 carbon atoms), an arylene group (preferably having 6 to 24 carbon atoms), a heteroarylene group (preferably having 1 to 6 carbon atoms), an imino group (preferably having 0 to 6 carbon atoms), an ether group, a thioether group, or a carbonyl group, or a combination thereof. Among these, a single bond or —$CR^5R^6$—$NR^7$— (an imino group becomes X or Y) is preferable. Here, $R^5R^6$'s each independently represent a hydrogen atom, a halogen atom, and an alkyl group (preferably having 1 to 6 carbon atoms). $R^7$ represents a hydrogen atom or an alkyl group having 1 to 6 carbon atoms.

$L^a$ is a structural site that forms a ring structure together with $CR^8CR^9$ and N, and is preferably a structural site that is combined with a carbon atom of $CR^8CR^9$ and that forms a nonaromatic heterocyclic ring having 3 to 7 carbon atoms. $L^a$ is more preferably a structural site that is combined with a carbon atom and N (nitrogen atom) of $CR^8CR^9$ and forms a 5-membered to 7-membered nonaromatic heterocyclic ring, even more preferably a structural site that forms a 5-membered nonaromatic heterocyclic ring, and particularly preferably a structural site that forms pyrrolidine. This structural site may further have a substituent such as an alkyl group.

X represents a group having a functional group with pKa of 14 or less.

Y represents a side chain having 40 to 10,000 atoms.

The resin (oligoimine-based resin) may further contain at least one selected from repeating units represented by Formulae (I-3), (I-4), and (I-5), as copolymer components. If the resin includes these repeating units, dispersibility of the pigment can be further improved.

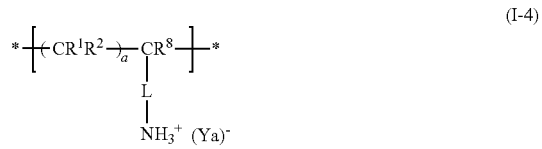

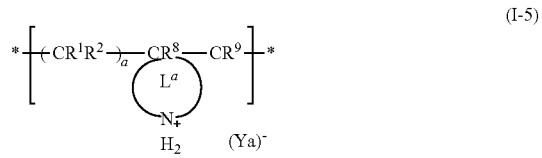

$R^1$, $R^2$, $R^8$, $R^9$, L, $L^a$, a, and * are the same as those regulated in Formulae (I-1), (I-2), and (I-2a).

Ya represents a side chain 40 to 10,000 atoms which has an anion group. The repeating unit represented by Formula (I-3) can be formed by adding an oligomer or a polymer that has a group that reacts with amine and forms salt to a resin that has a primary or secondary amino group in a main chain portion and causing reaction.

With respect to the oligoimine-based resin described above, disclosure of paragraph numbers 0102 to 0166 of JP2012-255128A can be referred to, and the contents thereof can be incorporated to this specification. Specific examples of the oligoimine-based resin include the following. Resins disclosed in paragraph numbers 0168 to 0174 of JP2012-255128A can be used.

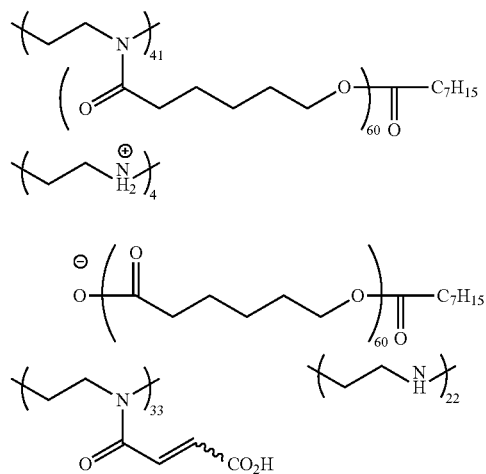

The resin can be obtained as commercially available products, and specific examples thereof include "Disperbyk-101 (polyamideamine phosphate salt), 107 (carboxylic acid ester), 110 and 111 (a copolymer containing an acid group), 130 (polyamide), 161, 162, 163, 164, 165, 166, and 170 (high molecular weight copolymer)" and "BYK-P104 and P105 (high molecular weight unsaturated polycarboxylic acid)" manufactured by BYK Chemie GmbH, "EFKA4047, 4050 to 4010 to 4165 (polyurethane-based), EFKA4330 to 4340 (block copolymer), 4400 to 4402 (modified polyacrylate), 5010 (polyesteramide), 5765 (high molecular weight polycarboxylate), 6220 (fatty acid polyester), 6745 (phthalocyanine derivative), and 6750 (azo pigment derivative)" manufactured by BASF SE, "AJISPER PB821, PB822, PB880, and PB881" manufactured by Ajinomoto Fine-Techno Co., Inc., "FLOWLEN TG-710 (urethane oligomer)" and "Polyflow No. 50E and No. 300 (acrylic copolymer)" manufactured by Kyoeisya Chemical Co., Ltd., "DISPARLON KS-860, 873SN, 874, and #2150 (aliphatic polyvalent carboxylic acid), #7004 (polyether ester), and DA-703-50, DA-705, and DA-725" manufactured by Kusumoto Chemicals Ltd., "DEMOL RN, and N (naphthalene sulfonic acid formalin polycondensate), MS, C, and SN—B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" manufactured by Kao Corporation, "SOLSPERSE 5000 (phthalocyanine derivative), 22000 (azo pigment derivative), 13240 (polyesteramine), 3000, 17000, and 27000 (polymers having functional groups at terminals thereof), 24000, 28000, 32000, and 38500 (graft-type polymers)" manufactured by Lubrizol Japan Limited, "NIKKOLE T106 (polyoxyethylene sorbitan monooleate) and MYS-IEX (polyoxyethylene monostearate)" manufactured by Nikko Chemicals Co., Ltd., "HINOACT T-8000E" manufactured by Kawaken Fine Chemicals Co., Ltd., "an organosiloxane polymer KP-341" manufactured by Shin-Etsu Chemical Co., Ltd., "W001: cationic surfactant", nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester, and anionic surfactants such as "W004, W005, and W017" manufactured by Yusho Co., Ltd., "EFKA-46, EFKA-47, EFKA-47EA, EFKA polymer 100, EFKA polymer 400, EFKA polymer 401, and EFKA polymer 450" manufactured by Morishita & Co., Ltd., polymer dispersants such as "DISPERSE AID 6, DISPERSE AID 8, DISPERSE AID 15, and DISPERSE AID 9100" manufactured by San Nopco Limited, ADEKA PLURONIC L31, F38, L42, L44, L61, L64, F68, L72, P95, F77, P84, F87, P94, L101, P103, F108, L121, and P-123 manufactured by ADEKA Corporation), and "IONET S-20" manufactured by Sanyo Chemical Industries.

As the resin, resins used in the manufacturing of the processed coloring agent can be used. Otherwise, alkali soluble resins described below may be used.

The content of the resin in the near-infrared absorption composition according to the invention is preferably 0.1 to 100 parts by mass with respect to 100 parts by mass. The upper limit is preferably 80 parts by mass or less, more preferably 70 parts by mass or less, and even more preferably 60 parts by mass or less. The lower limit is preferably 0.5 parts by mass or greater and more preferably 1 part by mass or greater. If the content of the resin is in the range described above, the dispersibility of the processed coloring agent is satisfactory.

<Preparation of Near-infrared Absorption Composition>

The near-infrared absorption composition according to the invention can be prepared by mixing the respective components described above. At the time of the preparation of the near-infrared absorption composition, respective components that form the near-infrared absorption composition are collectively formulated, or the respective components may be sequentially formulated after being dissolved or dispersed in an organic solvent. An input order or a work condition at the time of formulation is not particularly limited.

For the purpose of removing foreign substances, reducing defects, or the like, the near-infrared absorption composition according to the invention is preferably filtrated with a filter. The filter can be used without limitation, as long as the filter is used for the filtration use in the related art. Examples thereof include filters made of a fluorine resin such as polytetrafluoroethylene (PTFE), a polyamide resin such as nylon-6 and nylon-6,6, and polyolefin resin (including high density, ultrahigh molecular weight) such as polyethylene and polypropylene (PP). Among these materials, polypropylene (including high density polypropylene) and nylon are preferable.

A hole diameter of the filter is suitably about 0.1 to 7.0 µm, preferably about 0.2 to 2.5 µm, more preferably about 0.1 to 1.5 µm, and even more preferably about 0.3 to 0.7 µm. If the diameter is caused to be in this range, it is possible to securely remove fine foreign substances such as impurities or aggregates included in the composition, while the filter clogging is suppressed.

When the filter is used, other filters may be combined. At this point, the filtering in a first filter may be performed once or may be performed twice or more times. In a case where filtering is performed twice or more times by combining other filters, it is preferable that hole diameters of a second filter or thereafter are equal to or greater than a hole diameter of the first filter. A first filter having a different diameter in the range described above may be combined. As the hole diameter herein, a nominal value of a filter manufacturer can be referred to. A commercially available filters can be selected from, for example, various filters provided by Nihon Pall Ltd., Toyo Roshi Kaisha, Ltd., Entegris Japan Co., Ltd. (formerly, Mykrolis Corporation), or Kitz Microfilter Corporation.

As a second filter, a filter formed with the same material as the first filter described above can be used. A hole diameter of the second filter is suitably about 0.2 to 10.0 µm, preferably about 0.2 to 7.0 µm, and more preferably about 0.3 to 6.0 µm. If the hole diameter is in the range described above, foreign substances can be removed while component particles contained in the composition remain.

<Curable Composition>

The curable composition according to the invention includes the near-infrared absorption composition described above and a curable compound.

In the curable composition according to the invention, the content of the coloring agent can be adjusted, if necessary. For example, the content thereof is preferably 0.01 to 50 mass % with respect to the total solid content of the curable composition. The lower limit is preferably 0.1 mass % or greater and more preferably 0.5 mass % or greater. The upper limit is preferably 30 mass % or less and more preferably 15 mass % or less. In a case where the curable composition according to the invention includes two or more types of coloring agents, the total amount thereof is preferably in the range described above.

For example, the ratio of the processed coloring agent in the total proportion of the coloring agent is preferably 50 to 100 mass %. The lower limit is more preferably 60 mass % or greater and even more preferably 70 mass % or greater. The upper limit may be 95 mass % or less and may be 90 mass % or less.

<<Curable Compound>>

The curable composition according to the invention may contain a curable compound. The curable compound may be a compound having a polymerizable group (hereinafter, referred to as a "polymerizable compound") or may be a non-polymerizable compound such as a binder. The curable compound may have any chemical form such as a monomer, an oligomer, a prepolymer, or a polymer. With respect to the curable compound, paragraphs 0070 to 0191 of JP2014-41318A (paragraphs 0071 to 0192 of corresponding WO2014/017669A), and paragraphs 0045 to 0216 of JP2014-32380A can be referred to, and the contents thereof are incorporated to this specification.

As the curable compound, a polymerizable compound is preferable. Examples of the polymerizable compound include a compound including an ethylenically unsaturated bond and a polymerizable group such as cyclic ether (epoxy and oxetane). Examples of the ethylenically unsaturated bond preferably include a vinyl group, a styryl group, a (meth)acryloyl group, and a (meth)allyl group. The polymerizable compound may be a monofunctional compound having one polymerizable group or may be a polyfunctional compound having two or more polymerizable groups. However, a polyfunctional compound is preferable. If the curable composition contains a polyfunctional compound, heat resistance can be further increased.

Examples of the curable compound include monofunctional (meth)acrylate, polyfunctional (meth)acrylate (preferably trifunctional to hexafunctional (meth)acrylate), a polybasic acid-modified acrylic oligomer, and a polyfunctional epoxy resin such as an epoxy resin.

The content of the curable compound is preferably 1 to 90 mass % with respect to the total solid content of the curable composition. The lower limit is preferably 5 mass % or greater, more preferably 10 mass % or greater, and even more preferably 20 mass % or greater. The upper limit is preferably 85 mass % or less and more preferably 80 mass % or less. The curable compound may be used singly or two or more types thereof may be used in combination. In a case where two or more types are used, the total amount is preferably in the range described above.

<<<Compound Including Ethylenically Unsaturated Bond>>>

According to the invention, as the curable compound, a compound including an ethylenically unsaturated bond can be used. As examples of the compound including an ethylenically unsaturated bond, paragraphs 0033 and 0034 of JP2013-253224A can be referred to, and the contents thereof are incorporated to this specification.

As a compound including an ethylenically unsaturated bond, ethyleneoxy-modified pentaerythritol tetraacrylate (as a commercially available product, NK ESTER ATM-35E; manufactured by Shin-Nakamura Chemical Co., Ltd.), dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as commercially available products, KAYARAD DPHA; manufactured by Nippon Kayaku Co., Ltd., A-DPH-12E; manufactured by Shin-Nakamura Chemical Co., Ltd.), and a structure in which ethylene glycol, propylene glycol residues are interposed between these (meth)acryloyl groups are preferable. An oligomer type of these can be used.

Polymerizable compounds of paragraphs 0034 to 0038 disclosed in JP2013-253224A can be referred to, and the contents thereof are incorporated to this specification.

Examples thereof include polymerizable monomers disclosed in paragraphs 0477 of JP2012-208494A (<0585> of corresponding US2012/0235099A), and the contents thereof are incorporated to this specification.

Diglycerine ethyleneoxide (EO)-modified (meth)acrylate (as a commercially available product, M-460; manufactured by Toagosei Co., Ltd.) is preferable. Pentaerythritol tetraacrylate (manufactured by Shin-Nakamura Chemical Co., Ltd., A-TMMT), 1,6-hexanediol diacrylate (manufactured by Nippon Kayaku Co., Ltd., KAYARAD HDDA) is also preferable. An oligomer type of these can be used. Examples thereof include RP-1040 (manufactured by Nippon Kayaku Co., Ltd.).

A compound including an ethylenically unsaturated bond may have an acid group such as a carboxyl group, a sulfonic acid group, and a phosphoric acid group.

Examples of a compound including an ethylenically unsaturated bond having an acid group include ester between an aliphatic polyhydroxy compound and an unsaturated carboxylic acid. A compound caused to have an acid group by being reacted with a non-aromatic carboxylic anhydride is preferable in an unreacted hydroxyl group of an aliphatic polyhydroxy compound. Particularly preferably, in this ester, an aliphatic polyhydroxy compound is pentaerythritol and/or dipentaerythritol. Examples of a commercially available product include M-305, M-510, and M-520 of ARONIX series, as a polybasic acid-modified acrylic oligomer manufactured by Toagosei Co., Ltd.

An acid value of the compound including an acid group and an ethylenically unsaturated bond is preferably 0.1 to 40 mgKOH/g. The lower limit is preferably 5 mgKOH/g or greater. The upper limit is preferably 30 mgKOH/g or less.

<<<Compound Having Epoxy Group or Oxetanyl Group>>>

According to the invention, a compound having an epoxy group or an oxetanyl group can be used as a curable compound. Examples of the compound having an epoxy group or an oxetanyl group include a polymer having an epoxy group on a side chain, and a monomer or a oligomer that has two or more epoxy groups in a molecule. Examples thereof include a bisphenol A-type epoxy resin, a bisphenol F-type epoxy resin, a phenol novolac-type epoxy resin, a cresol novolac-type epoxy resin, and an aliphatic epoxy resin. Examples thereof include a monofunctional or polyfunctional glycidyl ether compound, and a polyfunctional aliphatic glycidyl ether compound is preferable.

The weight-average molecular weight is preferably 500 to 5,000,000 and more preferably 1,000 to 500,000.

As these compounds, commercially available products may be used, or these compounds obtained by introducing an epoxy group to a side chain of a polymer can be used.

As a commercially available product, for example, disclosure of paragraph 0191 of JP2012-155288A can be referred to, and the contents thereof are incorporated to this specification.

Examples of a commercially available product include a polyfunctional aliphatic glycidyl ether compound such as DENACOL EX-212L, EX-214L, EX-216L, EX-321L, and EX-850L (above, manufactured by Nagase ChemteX Corporation). These are low chlorine products, but EX-212, EX-214, EX-216, EX-321, EX-850, and the like which are not low chlorine products can be used in the same manner.

Examples thereof also include ADEKA RESIN EP-4000S, ADEKA RESIN EP-4003S, ADEKA RESIN EP-4010S, and ADEKA RESIN EP-4011S (above, manufactured by ADEKA Corporation), NC-2000, NC-3000, NC-7300, XD-1000, EPPN-501, and EPPN-502 (above, manufactured by ADEKA Corporation), JER10315, CELLOXIDE 2021P, CELLOXIDE 2081, CELLOXIDE 2083, CELLOXIDE 2085, EHPE3150, EPOLEAD PB 3600, EPOLEAD PB 4700 (above, manufactured by Daicel Corporation), CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (above, manufactured by Daicel Corporation).

Examples of a commercially available product of the phenol novolac-type epoxy resin include JER-157565, JER-152, JER-154, and JER-157570 (above are manufactured by Mitsubishi Chemical Corporation).

As specific examples of a polymer having an oxetanyl group on a side chain and a polymerizable monomer or a polymerizable oligomer that have two or more oxetanyl groups in a molecule, ARON OXETANE OXT-121, OXT-221, OX-SQ, and PNOX (above, manufactured by Toagosei Co., Ltd.) can be used.

As a compound having an epoxy group, a compound having a glycidyl group as a epoxy group such as glycidyl (meth)acrylate or allyl glycidyl ether can be used, but a preferable compound is an unsaturated compound having an alicyclic epoxy group. As this compound, disclosure of paragraph 0045 or the like of JP2009-265518A can be referred to, and the contents thereof are incorporated to this specification.

The compound including an epoxy group or an oxetanyl group may include a polymer having an epoxy group or an oxetanyl group as a repeating unit.

<<<Other Curable Compounds>>>

According to the invention, a polymerizable compound having a caprolactone-modified structure as a curable compound can be used.

As a polymerizable compound having a caprolactone-modified structure, disclosure of paragraphs 0042 to 0045 of JP2013-253224A can be referred to, and the contents thereof are incorporated to this specification.

Examples of the polymerizable compound having a caprolactone-modified structure include DPCA-20, DPCA-30, DPCA-60, and DPCA-120 which are commercially available as KAYARAD DPCA series from Nippon Kayaku Co., Ltd., SR-494 which is tetrafunctional acrylate having four ethyleneoxy chains manufactured by Sartomer, and TPA-330 which is a trifunctional acrylate having three isobutyleneoxy chains.

<<Polymerization Initiator>>

The curable composition may include a polymerization initiator. The polymerization initiator is not particularly limited, as long as the polymerization initiator has performance of initiating polymerization of a polymerizable compound due to light, heat, or the both. The polymerization initiator can be appropriately selected according to the purpose.

In a case where the polymerization of the polymerizable compound is initiated with light, a photopolymerization initiator is preferable. The photopolymerization initiator preferably has photosensitivity to a range from an ultraviolet range to visible light.

In a case where a polymerizable compound is polymerized with heat, a thermal polymerization initiator is preferable. The thermal polymerization initiator is preferably decomposed at 150° C. to 250° C.

The polymerization initiator is preferably a compound having at least an aromatic group, and examples thereof include an acylphosphine compound, an acetophenone-based compound, an α-aminoketone compound, a benzophenone-based compound, a benzoin ether-based compound, a ketal derivative compound, a thioxanthone compound, an oxime compound, a hexaarylbiimidazole compound, a trihalomethyl compound, an azo compound, an organic peroxide, an onium salt compound such as a diazonium compound, an iodonium compound, a sulfonium compound, an azinium compound, and a metallocene compound, an organic boron salt compound, a disulfone compound, and a thiol compound.

As the polymerization initiator, paragraphs 0218 to 0251 of JP2014-41318A (paragraphs 0220 to 0253 of corresponding WO2014/017669A), and the contents thereof are incorporated to this specification.

The polymerization initiator is preferably an oxime compound, an acetophenone compound, or an acylphosphine compound.

Examples of the commercially available oxime compound include IRGACURE-OXE01 (manufactured by BASF SE), IRGACURE-OXE02 (manufactured by BASF SE), TR-PBG-304 (manufactured by Changzhou Tronly New Electronic Material Co., LTD.), ADEKA ARKLS NCI-831 (manufactured by ADEKA Corporation), and ADEKA ARKLS NCI-930 (manufactured by ADEKA Corporation).

Commercially available products of the acetophenone compound include IRGACURE-907, IRGACURE-369, and IRGACURE-379 (product name: all manufactured by BASF SE).

Commercially available products of the acylphosphine compound include IRGACURE-819 and DAROCUR-TPO (product name: all are manufactured by BASF SE).

In the a case where the curable composition according to the invention contains a polymerization initiator, the content of the polymerization initiator is preferably 0.01 to 30 mass % with respect to the total solid content of the curable composition. The lower limit is preferably 0.1 mass % or greater. The upper limit is preferably 20 mass % or less and more preferably 15 mass % or less. The polymerization initiator may be used singly or two or more types thereof may be used in combination. In a case where two or more types are used, a total amount is preferably in the range described above.

<<Alkali Soluble Resin>>

The curable composition according to the invention may contain an alkali soluble resin. If the alkali soluble resin is contained, desired patterns can be formed by alkali development.

The alkali soluble resin can be appropriately selected from alkali soluble resins which are linear organic high molecular polymers and have at least one group that promotes alkali solubility in a molecule (preferably, a molecule using an acrylic copolymer or a styrene-based copolymer as a main chain). A polyhydroxystyrene-based resin, a polysiloxane-based resin, an acrylic resin, an acrylamide-based resin, and an acrylic/acrylamide copolymer resin are preferable, and an acrylic resin, an acrylamide-based resin, and an acrylic/acrylamide copolymer resin are more preferable.

Examples of a group promoting alkali solubility (hereinafter, also referred to as an acid group) include a carboxyl group, a phosphoric acid group, a sulfonic acid group, and a phenolic hydroxyl group. However, groups that are soluble to an organic solvent and can be developed by a weak alkali aqueous solution are preferable, and (meth)acrylic acid is particularly preferable. These acid groups may be used singly or two or more types thereof may be used in combination. As the alkali soluble resin, disclosure of paragraphs 0558 to 0571 (<0685> to <0700> of corresponding US2012/0235099A) or following paragraphs of JP2012-208494A is referred to, and the contents thereof are incorporated to this specification.

As the alkali soluble resin, a resin including a compound represented by Formula (ED) below as a copolymer component is also preferable.

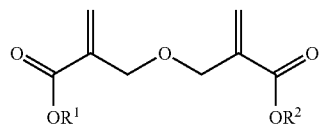

(ED)

In Formula (ED), $R^1$ and $R^2$ each independently represent a hydrocarbon group having 1 to 25 carbon atoms that may have a hydrogen atom or a substituent.

The hydrocarbon group having 1 to 25 carbon atoms which is represented by $R^1$ and $R^2$ is not particularly limited. Examples thereof include a linear or branched alkyl group such as methyl, ethyl, n-propyl, isopropyl, n-butyl, isobutyl, t-butyl, t-amyl, stearyl, lauryl, and 2-ethylhexyl; an aryl group such as phenyl; an alicyclic ring-type group such as cyclohexyl, t-butylcyclohexyl, dicyclopentadienyl, tricyclodecanyl, isobornyl, adamantyl, and 2-methyl-2-adamantyl; an alkyl group substituted with alkoxy group such as 1-methoxyethyl and 1-ethoxyethyl, and an alkyl group substituted with an aryl group such as benzyl. Among these, particularly, a primary or secondary hydrocarbon group that hardly separates due to acid or heat, such as methyl, ethyl, cyclohexyl, and benzyl is preferable in view of heat resistance.

$R^1$ and $R^2$ may be the same substituents or may be different substituents.

Examples of the compound represented by Formula (ED) include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(n-butyl)-2,2'-[oxybis(methylene)]bis-2-propenoate, di(t-butyl)-2,2'-[oxybis(methylene)]bis-2-propenoate, and di(isobutyl)-2,2'-[oxybis(methylene)]bis-2-propenoate. Among these, diethyl-2,2'-[oxybis(methylene)]bis-2-propenoate is preferable.

The copolymer components in addition to the compound represented by Formula (ED) are not particularly limited.

For example, in view of easy handleability such as solubility to a solvent, aryl (meth)acrylate, alkyl (meth)acrylate, and polyethyleneoxy (meth)acrylate are preferably included as a copolymer component, and aryl (meth)acrylate and alkyl (meth)acrylate are more preferable.

In view of alkali developability, a monomer having a carboxyl group such as (meth)acrylic acid and itaconic acid containing an acidic group, a monomer having a phenolic hydroxyl group such as N-hydroxyphenyl maleimide, and a monomer having a carboxylic acid anhydride group such as maleic anhydride and itaconic anhydride are preferably included as copolymer components, and (meth)acrylic acid is more preferable.

Examples of a preferable combination of copolymer components include a combination of the compound represented by Formula (ED), benzyl methacrylate, and methyl methacrylate, and/or methacrylic acid.

With respect to the resin including the compound represented by Formula (ED) as the copolymer component, disclosure of paragraph numbers 0079 to 0099 of JP2012-198408A can be referred to, and the contents thereof are incorporated to this specification.

The acid value of the alkali soluble resin is preferably 30 to 200 mgKOH/g. The lower limit is preferably 50 mgKOH/g or greater and more preferably 70 mgKOH/g or greater. The upper limit is preferably 150 mgKOH/g or less and more preferably 120 mgKOH/g or less.

The weight-average molecular weight (Mw) of the alkali soluble resin is preferably 2,000 to 50,000. The lower limit is preferably 5,000 or greater and more preferably 7,000 or greater. The upper limit is preferably 30,000 or less and more preferably 20,000 or less.

In a case where the curable composition according to the invention contains an alkali soluble resin, the content of the alkali soluble resin is preferably 1 mass % or greater, may be 2 mass % or greater, may be 5 mass % or greater, and may be 10 mass % or greater with respect to a total solid content of the curable composition according to the invention. The content of the alkali soluble resin may be 80 mass % or less, may be 65 mass % or less, may be 60 mass % or less, and may be 15 mass % or less with respect to the total solid content of the curable composition according to the invention.

In a case where a pattern is not formed by an alkali development by using the curable composition according to the invention, it is obvious that an aspect of not containing an alkali soluble resin is possible.

<<Surfactant>>

The curable composition according to the invention may include a surfactant. The surfactant may be used singly or two or more types thereof may be used in combination. The content of the surfactant is preferably 0.0001 to 2 mass % with respect to the solid content of the curable composition according to the invention. The lower limit is preferably 0.005 mass % or greater and more preferably 0.01 mass % or greater. The upper limit is preferably 1.0 mass % or less and more preferably 0.1 mass % or less.

As the surfactant, various surfactants such as a fluorine-based surfactant, a nonionic surfactant, a cationic surfactant, an anion-based surfactant, and a silicone-based surfactant can be used. The curable composition according to the invention preferably contains at least one of a fluorine-based surfactant or a silicone-based surfactant. Interfacial tension between a coated surface and a coating liquid decreases, and wettability to the coated surface improves. Therefore, liquid characteristics (particularly, fluidity) of the curable composition increases, and evenness after coating and liquid saving properties further improve. As a result, even in a case where a thin film having about several μm is formed with a small amount of a liquid, a film with homogeneous thickness that has small unevenness can be formed.

A fluorine content of the fluorine-based surfactant is preferably 3 to 40 mass %. The lower limit is preferably 5 mass % or greater and more preferably 7 mass % or greater. The upper limit is preferably 30 mass % or less and even more preferably 25 mass % or less. A case where the fluorine content is in the range described above is effective in view of evenness of the thickness of the coated film and liquid saving properties, and solubility is also satisfactory.

Specific examples of the fluorine-based surfactant include surfactants disclosed in paragraphs 0060 to 0064 of JP2014-41318A (paragraphs 0060 to 0064 of corresponding WO2014/17669A) and the contents thereof are incorporated to this specification. Examples of the commercially available product of the fluorine-based surfactant include MEGAFACE F-171, MEGAFACE F-172, MEGAFACE F-173, MEGAFACE F-176, MEGAFACE F-177, MEGA- FACE F-141, MEGAFACE F-142, MEGAFACE F-143, MEGAFACE F-144, MEGAFACE R30, MEGAFACE F-437, MEGAFACE F-475, MEGAFACE F-479, MEGAFACE F-482, MEGAFACE F-554, MEGAFACE F-780, MEGAFACE F-781F (above, manufactured by DIC Corporation), FLUORAD FC430, FLUORAD FC431, FLUORAD FC171 (above, manufactured by Sumimoto 3M Limited.), SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (above, Asahi Glass Co., Ltd.).

Specific examples of the nonionic surfactant further include nonionic surfactants disclosed in paragraph 0553 of JP2012-208494A (<0679> of corresponding US2012/0235099A), and the contents thereof are incorporated to this specification.

Specific examples of the cationic surfactant include cationic surfactants disclosed in paragraph 0554 of JP2012-208494A (<0680> of corresponding US2012/0235099A), and the contents thereof are incorporated to this specification.

Specific examples of the anionic surfactant include W004, W005, and W017 (manufactured by Yusho Co. Ltd.)

Examples of the silicone-based surfactant include silicone-based surfactants disclosed in paragraph 0556 of JP2012-208494A (<0682> of corresponding US2012/0235099A), and the contents thereof are incorporated to this specification.

<<Polymerization Inhibitor>>

In the manufacturing or preservation, the curable composition according to the invention may contain a small amount of polymerization inhibitor, in order to preventing unnecessary reaction of the curable compound.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerous salt, and p-methoxyphenol is preferable.

In a case where the curable composition according to the invention contains a polymerization inhibitor, the content of the polymerization inhibitor is preferably 0.01 to 5 mass % with respect to the total solid content of the curable composition of the invention.

<<Organic Solvent>>

The curable composition according to the invention may contain an organic solvent. Examples of the organic solvent include those described in the near-infrared absorption composition above, and preferable ranges thereof are also the same. At least one or more selected from cyclopentanone, cyclohexanone, propylene glycol monomethyl ether acetate, N-methyl-2-pyrrolidone, butyl acetate, ethyl lactate, and propylene glycol monomethyl ether are preferable.

With respect to the content of the organic solvent in the curable composition according to the invention, a total solid content of the curable composition according to the invention is preferably an amount of 5 to 90 mass %, more preferably an amount of 10 to 80 mass %, and even more preferably an amount of 20 to 75 mass %.

<<Other Coloring Agent>>

The curable composition according to the invention may further include other coloring agents described above. Examples of the other coloring agents include coloring agents described above. The other coloring agents can be appropriately selected by the use of the curable composition.

<<Other Components>>

In the curable composition according to the invention, other components are appropriately selected and used depending on the purpose, without deteriorating the effect of the invention.

Examples of other components that can be used together include a dispersing agent, a sensitizing agent, a crosslinking agent (crosslinking agent aqueous solution), acetic anhydride, a silane compound, a hardening accelerator, a filler, a plasticizer, an adhesion promoter, and other auxiliary agents (for example, conductive particles, a filler, an antifoaming agent, a flame retardant, a leveling agent, a peeling promoter, an antioxidant, a fragrance material, a surface tension adjuster, and a chain transfer agent) may be used together.

As these components, for example, disclosure in paragraph numbers 0183 to 0228 of JP2012-003225A (<0237> to <0309> of corresponding US2013/0034812A), paragraph numbers 0101 and 0102 of JP2008-250074A, paragraph numbers 0103 to 0104 of JP2008-250074A, paragraph numbers 0107 and 0109 of JP2008-250074A, and paragraph numbers 0159 to 0184 of JP2013-195480A can be referred to, and the contents thereof are incorporated to this specification.

If these components are appropriately contained, desired properties such as stability of the near-infrared cut filter and film characteristics can be adjusted.

<Preparation of Curable Composition>

The curable composition according to the invention can be prepared by mixing respective components described above. For the purpose of removing foreign substances or reducing defects, it is preferable that filtration is performed with a filter. Examples of the types of filter and the filtration method include those described in the composition, and preferable ranges thereof are also the same.

<Use of Curable Composition>

The curable composition according to the invention can be caused to be liquid, and thus a cured film such as the near-infrared cut filter can be easily manufactured by applying the curable composition according to the invention to a base material or the like and drying the curable composition.

In a case where a cured film is formed by coating, the viscosity of the curable composition according to the invention is preferably 1 to 3,000 mPa·s. The lower limit is preferably 10 mPa·s or greater and more preferably 100 mPa·s or greater. The upper limit is preferably 2,000 mPa·s or less and more preferably 1,500 mPa·s or less.

The total solid content of the curable composition according to the invention is changed depending on the coating method. However, for example, the total solid content is preferably 1 to 50 mass %. The lower limit is more preferably 10 mass % or greater. The upper limit is more preferably 30 mass % or less.

The use of the curable composition according to the invention is not particularly limited. However, for example, the curable composition according to the invention can be preferably used for a near-infrared cut filter (for example, for a near-infrared cut filter to a wafer leveling lens) of a solid-state imaging device on a light receiving side or a near-infrared cut filter of a solid-state imaging device on a back surface side (an opposite side of a light receiving side). The curable composition according to the invention can be particularly preferably used as a near-infrared cut filter of a solid-state imaging device on a light receiving side. The curable composition according to the invention can be used as a near-infrared cut filter in an infrared sensor that detects an object by detecting light at a wavelength of 700 to 1,000 nm.

The curable composition can be used for forming an infrared transmission filter that can transmit near-infrared rays having a specific wavelength or greater. For example, an infrared transmission filter that blocks light at a wavelength of 400 to 900 nm and that transmits near-infrared rays at a wavelength of 900 nm or greater can be formed.

<Cured Film and Near-infrared Cut Filter>

Subsequently, the cured film and the near-infrared cut filter according to the invention are described.

The cured film and the near-infrared cut filter according to the invention are obtained by curing the curable composition according to the invention described above.

Film thicknesses of the cured film and the near-infrared cut filter of the invention can be appropriately adjusted depending on purposes. The film thicknesses are preferably 300 μm or less, more preferably 200 μm or less, and particularly preferably 100 μm or less. For example, the lower limit of the film thicknesses is preferably 0.1 μm or greater, more preferably 0.2 μm or greater, and even more preferably 0.5 μm or greater.

The near-infrared cut filter and the cured film according to the invention can be used for a lens (a lens for a camera such as a digital camera, a cellular phone, or a vehicle camera, or an optical lens such as a f-θ lens or a pickup lens) having a function of absorbing and cutting infrared rays, an optical filter for a semiconductor light-receiving element, a near-infrared absorption film or a near-infrared absorption plate that cuts off heat rays for energy saving, an agricultural coating agent for the purpose of selective use of sunlight, a recording medium that uses absorption heat of near-infrared rays, a near-infrared filter for electronic equipment and photos, safety glasses, sunglasses, a heat ray cut film, recording for optical character reading, the use of the confidential document copy prevention, an electrophotographic photoreceptor, laser welding, and the like. The near-infrared cut filter and the cured film according to the invention can also used for a noise cut filter for a CCD camera, a filter for a CMOS image sensor, and a filter for an infrared sensor.

<Method of Manufacturing Cured Film and Near-infrared Cut Filter>

The cured film and the near-infrared cut filter of the invention can be manufactured by a step of applying the curable composition according to the invention. Specifically, the cured film and the near-infrared cut filter can be manufactured by a step of forming a film by applying the curable composition according to the invention to a support and a step of drying the film. Film thicknesses and laminate structures can be appropriately selected depending on purposes. A step of forming patterns may be further performed.

A step of forming a film can be performed, by using the curable composition according to the invention on a support by a dropwise addition method (drop cast), a spin coater, a slit spin coater, a slit coater, screen printing, applicator coating, and the like. The thickness of the film after drying is not particularly limited, and can be appropriately selected depending on the purpose.

The support is applied may be a transparent substrate consisting of glass or the like. The support may be a solid-state imaging device, may be another substrate provided on a light receiving side of the solid-state imaging device, and may be a layer such as a planarizing layer or the like provided on a light receiving side of the solid-state imaging device.

In a step of drying a film, the dry condition is different depending on respective components, types of solvents, use ratio, and the like. For example, the dry condition is preferably in a temperature of 60° C. to 150° C. for about 30 seconds to 15 minutes.

Examples of the step of forming a pattern include methods including a step of forming a film-shaped composition layer obtained by applying the curable composition according to the invention on the support, a step of exposing the composition layer in a pattern shape, and a step of forming a pattern by developing and removing unexposed portions, and the like. As a step of forming a pattern, photolithography or a dry etching method may be used for forming a pattern.

In the method of manufacturing the cured film and the near-infrared cut filter, other steps may be included. The other steps are not particularly limited, and can be appropriately selected depending on purposes. Examples thereof include a step of treating a surface of a substrate, a preheating step (prebaking step), a curing treatment step, and a post heating step (post baking step).

<<Preheating Step and Post Heating Step>>

The heating temperature in the preheating step and post heating step is preferably 80° C. to 200° C. The upper limit is preferably 150° C. or less. The lower limit is preferably 90° C. or greater.

The heating time in the preheating step and the post heating step is preferably 30 to 240 seconds. The upper limit is preferably 180 seconds or less. The lower limit is preferably 60 seconds or greater.

<<Curing Treatment Step>>

A curing treatment step is a step of performing a curing treatment on a formed film, if necessary. If this treatment is performed, mechanical strength of the cured film and the near-infrared cut filter is improved.

The curing treatment step is not particularly limited, and can be appropriately selected depending on purposes. Examples thereof suitably include an exposure treatment and an entire surface heating treatment. Here, the expression "exposure" according to the invention is used as a meaning of including not only light in various wavelengths but also radioactive ray irradiation such as electron rays or X rays.

The exposure is preferably performed by irradiation of radioactive rays. As the radioactive that can be used at the time of exposure, particularly, electron rays, KrF, ArF, ultraviolet rays such as g rays, h rays, and i rays, or visible light are preferably used.

Examples of an exposure technique include stepper exposure or exposure by a high pressure mercury vapor lamp.

An exposure amount is preferably 5 to 3,000 mJ/cm$^2$. The upper limit is preferably 2,000 mJ/cm$^2$ or less and more preferably 1,000 mJ/cm$^2$ or less. The lower limit is preferably 10 mJ/cm$^2$ or greater and more preferably 50 mJ/cm$^2$ or greater.

Examples of the entire surface exposure treatment include a method of exposing an entire surface of the formed film. In a case where the curable composition contains a polymerizable compound, curing of the polymerizable compounds is promoted by the entire surface exposure, such that curing of the film further proceeds, and mechanical strength and durability further improve.

A device for performing the entire surface exposure is not particularly limited, and can be appropriately selected depending on purposes, and examples thereof suitably include a ultraviolet exposure machine such as a high pressure mercury vapor lamp.

Examples of the entire surface heating treatment method include a method of heating the entire surface of the formed film. With the heating of the entire surface, the film hardness of the pattern can be increased.

The heating temperature of the heating of the entire surface is preferably 100° C. to 260° C. The lower limit is preferably 120° C. or greater and more preferably 160° C. or greater. The upper limit is preferably 240° C. or less and more preferably 220° C. or less. If the heating temperature is in the range described above, a film having excellent strength can be easily obtained.

The heating time when the entire surface is heated is preferably 1 to 180 minutes. The lower limit is preferably 3 minutes or longer. The upper limit is preferably 120 minutes or less.

A device for heating the entire surface is not particularly limited, and can be appropriately selected among well-known devices, depending on purposes. Examples thereof include a dry oven, a hot plate, and an infrared (IR) heater.

<Solid-state Imaging Device, Camera Module, and Infrared Sensor>

The solid-state imaging device according to the invention is obtained by using the curable composition according to the invention or includes the cured film according to the invention.

The camera module according to the invention has a solid-state imaging device and the near-infrared cut filter according to the invention.

The infrared sensor according to the invention is obtained by using the curable composition according to the invention or includes the cured film according to the invention.

Hereinafter, one embodiment of the infrared sensor according to the invention is described by using FIG. 1.

In an infrared sensor 100 illustrated in FIG. 1, a reference numeral 110 is a solid-state imaging device.

An image pick-up area provided on the solid-state imaging device 110 has infrared cut filter 111 and a color filter 112. The near-infrared cut filter 111 can be formed, for example, by using the curable composition according to the invention.

Areas 114 are provided between infrared transmission filters 113 and the solid-state imaging device 110. Resin layers (for example, transparent resin layers) that light in a wavelength that transmits the infrared transmission filters 113 transmits are provided on the areas 114. In the embodiment illustrated in FIG. 1, a resin layer is provided on the areas 114, but the infrared transmission filters 113 may be formed on the areas 114. That is, the infrared transmission filters 113 may be formed on the solid-state imaging device 110.

Microlenses 115 are provided on incidence rays hυ side of the color filters 112 and the infrared transmission filters 113. A planarizing layer 116 is formed so as to cover the microlenses 115.

According to the embodiment illustrated in FIG. 1, film thicknesses of the color filters 112 and film thicknesses of the infrared transmission filters 113 are the same, but film thicknesses of the both may be different from each other.

According to the embodiment illustrated in FIG. 1, the color filters 112 are provided on the incidence rays hυ side of the near-infrared cut filters 111, but the near-infrared cut filters 111 may be provided on the incidence rays hυ side of the color filters 112 by changing an order of the near-infrared cut filters 111 and the color filters 112.

According to the embodiment illustrated in FIG. 1, the near-infrared cut filters 111 and the color filters 112 are laminate to be adjacent to each other, but both of the filters do not have to be adjacent to each other and other layers may be interposed therebetween.

<<Near-infrared Cut Filter 111>>

Characteristics of the near-infrared cut filter 111 are selected by a light emitting wavelength of an infrared light emitting diode (infrared LED) described below. For example, the near-infrared cut filter 111 can be formed by using the curable composition according to the invention described above.

<<Color Filter 112>>

The color filters 112 are not particularly limited, and color filters for forming pixels in the related art can be used. For example, disclosure in paragraphs 0214 to 0263 of JP2014-043556A can be referred to, and the contents thereof are incorporated to this specification.

<<Infrared Transmission Filter 113>>

Characteristics of the infrared transmission filters 113 are selected depending on a light emitting wavelength of an infrared LED described below. For example, description below are provided in an assumption that a light emitting wavelength of an infrared LED is 830 nm.

With respect to the infrared transmission filters 113, a maximum value of the light transmittance in the thickness direction of the film in a wavelength range of 400 to 650 nm are preferably 30% or less, more preferably 20% or less, even more preferably 10% or less, and particularly preferably 0.1% or less. The transmittance thereof preferably satisfies the condition above in the entire wavelength range of 400 to 650 nm. A maximum value in the wavelength range of 400 to 650 nm is generally 0.1% or greater.

With respect to the infrared transmission filter 113, a minimum value of the light transmittance in a thickness direction of the film at a wavelength range of 800 nm or greater (preferably 800 to 1,300 nm) is preferably 70% or greater, more preferably 80% or greater, even more preferably 90% or greater, and particularly preferably 99.9% or greater. The transmittance thereof preferably satisfies the conditions described above at a portion of a wavelength range of 800 nm or greater and preferably satisfies the conditions described above at a wavelength of the light emitting wavelength of the infrared LED. The minimum value of the light transmittance in the wavelength range of 900 to 1,300 nm is generally 99.9% or less.

The film thickness is preferably 100 μm or less, more preferably 15 μm or less, even more preferably 5 μm or less, and particularly preferably 1 μm or less. The lower limit value is preferably 0.1 μm. If the film thickness in the range described above, it is possible to cause the film to satisfy spectroscopic properties described above.

The spectroscopic properties, a method of measuring a film thickness, and the like are provided below.

The film thickness is measured by using a substrate after drying that has a film and a stylus type surface profile measuring device (DEKTAK150 manufactured by ULVAC Inc.).

The spectral characteristics of the film are values obtained by measuring transmittance in a wavelength range of 300 to 1,300 nm by using a spectrophotometer (ref glass substrate) of a ultraviolet-visible-near-infrared spectrophotometer (U-4100 manufactured by Hitachi High-Technologies Corporation).

Conditions of the light transmittance may be achieved by any means. However, for example, conditions of the light transmittance can be achieved by causing the composition to contain two or more types of pigments and adjusting types and contents of and of respective pigments.

For example, the infrared transmission filter 113 can be manufactured by using a composition (infrared transmissive composition) including the colorant described above (preferably, a colorant containing two or more colorants selected from a red colorant, a yellow colorant, a blue colorant, and a violet colorant). The curable composition according to the invention can be manufactured by using the composition further containing the colorant in addition to the processed coloring agent described above.

The content of the pigment in the colorant is preferably 95 mass % or greater, more preferably 97 mass % or greater, and even more preferably 99 mass % or greater with respect to a total amount of the colorant. The upper limit of the content of the pigment in the colorant is 100 mass % or less with respect to the total amount of the colorant.

As the preferable aspect of the colorant, two or more colorants selected from a red colorant, a yellow colorant, a blue colorant, and a purple colorant are preferably contained, and a red colorant, a yellow colorant, a blue colorant, and a purple colorant are more preferably contained. As preferable specific examples, it is preferable to contain C. I. pigment red 254 as a red pigment, C. I. pigment yellow 139 as a yellow pigment, C. I. pigment blue 15:6 as a blue pigment, and C. I. pigment violet 23 as a violet pigment.

In a case where the colorant contained in the infrared transmissive composition is obtained by combining a red colorant, a yellow colorant, a blue colorant, and a violet colorant, it is preferable that a mass ratio of the red colorant is 0.2 to 0.5, a mass ratio of the yellow colorant is 0.1 to 0.2, a mass ratio of the blue colorant is 0.25 to 0.55, and a mass ratio of the violet colorant is 0.05 to 0.15 with respect to the total amount of the colorant. It is more preferable that a mass ratio of the red colorant is 0.3 to 0.4, a mass ratio of the yellow colorant is 0.1 to 0.2, a mass ratio of the blue colorant is 0.3 to 0.4, and a mass ratio of the violet colorant is 0.05 to 0.15 with respect to the total amount of the colorant.

Subsequently, an image pick-up device as an example in which the infrared sensor according to the invention is applied is described. As the infrared sensor, a motion sensor, a proximity sensor, a gesture sensor, and the like exist.

Figure 2:
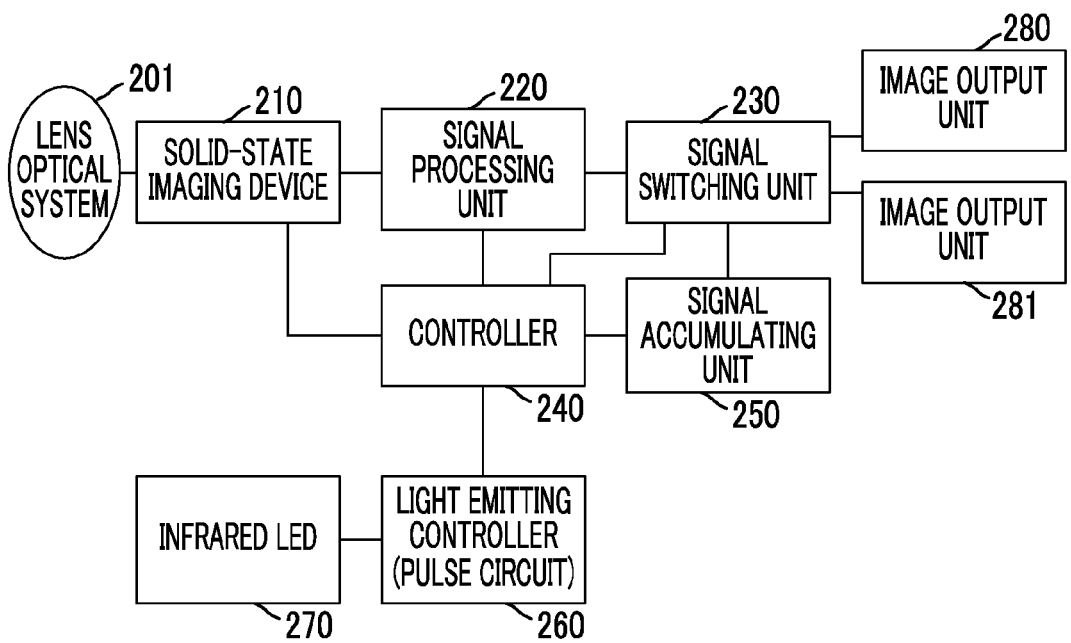
FIG. 2 is a block diagram illustrating functions of an image pick-up device to which an infrared sensor according to the invention is applied.

FIG. 2 is a functional block diagram of an image pick-up device. The image pick-up device includes a lens optical system 201, a solid-state imaging device 210, a signal processing unit 220, a signal switching unit 230, a controller 240, a signal accumulating unit 250, a light emitting controller 260, an infrared LED 270 of a light emitting element that emitting infrared light, and image output units 280 and 281. As the solid-state imaging device 210, the infrared sensor 100 described above can be used. All or a portion of the configurations except for those of the solid-state imaging device 210 and the lens optical system 201 may be formed on the same semiconductor substrate. With respect to the respect configurations of the image pick-up device, paragraphs 0032 to 0036 of JP2011-233983A are referred to, and the contents thereof are incorporated to this specification.

A camera module having a solid-state imaging device and the near-infrared cut filter described above is incorporated to the image pick-up device.

<Processed Coloring Agent>

Subsequently, the processed coloring agent according to the invention is described.

The processed coloring agent according to the invention is a processed coloring agent described in the near-infrared absorption composition according to the invention, and preferable ranges thereof are also the same as described above.

For example, the processed coloring agent according to the invention can be used for a use of optical filters as an infrared cut filter, a heat ray shielding film, and an infrared transmission filter in a plasma display panel (PDP), a CCD, an infrared sensor, and the like, a use of a photothermal conversion material as a recordable optical disk (CD-R) or a flash melt fixing material, and a use of information display materials as security ink and invisible barcode ink.

EXAMPLES

Hereinafter, the invention is described in detail with reference to examples. Materials, use amounts, ratios, process details, process orders, and the like provided in the examples below can be appropriately changed without departing from the gist of the invention. Accordingly, ranges of the invention are not limited to the specific examples described below. Unless described otherwise, "%" and "parts" are based on a mass.

<Synthesis of Compound (A-1)>

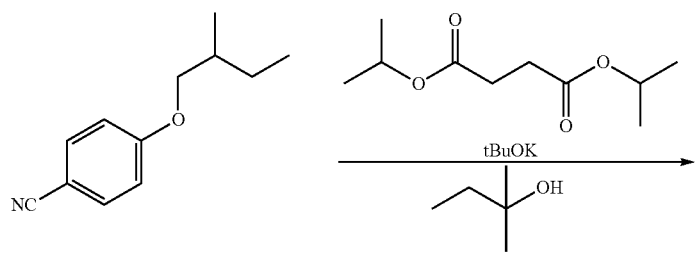

-continued
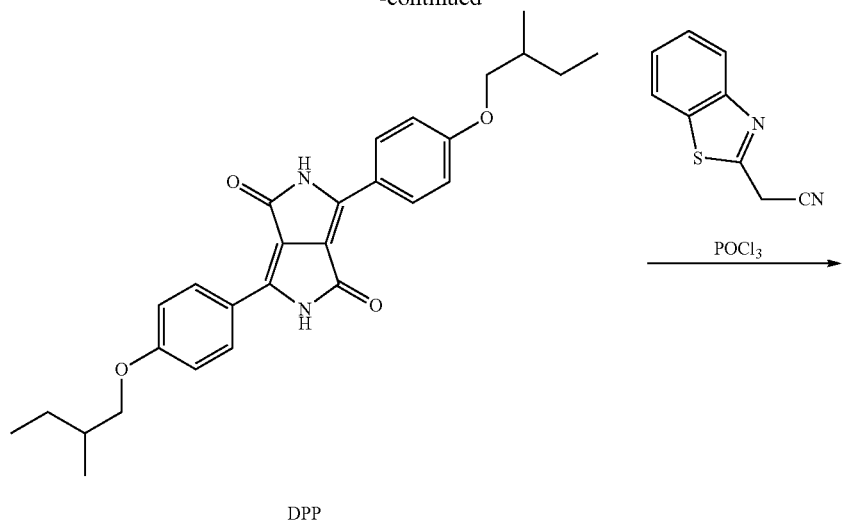
DPP
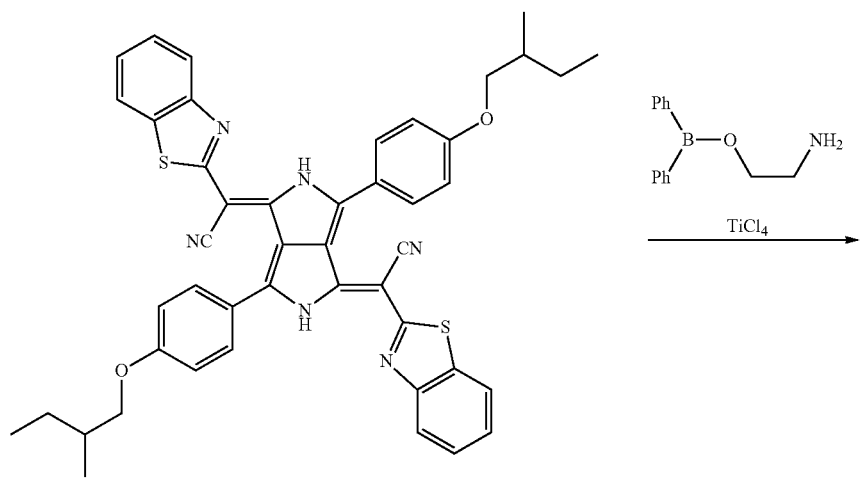
(A-1-a)
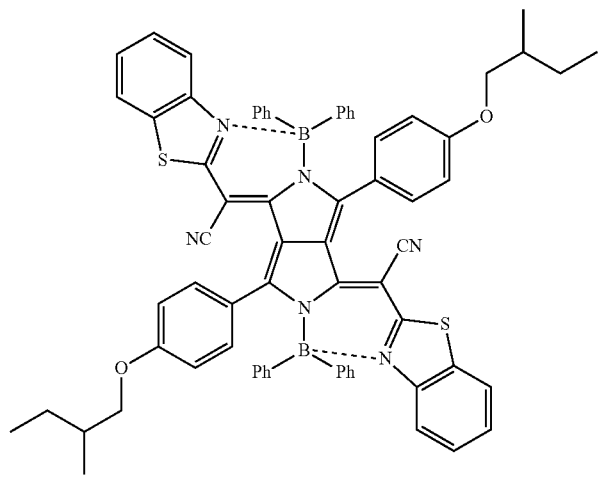
(A-1)

<<Synthesis of Compound (A-1-a)>>

An exemplary compound (A-1-a) was prepared according to the scheme below. First, a diketopyrrolopyrrole compound (DPP) was synthesized by using 4-(2-methylbutoxy) benzonitrile as a raw material by a method disclosed in U.S. Pat. No. 5,969,154A.

$^1$H-NMR (DMSO+THF mixture): δ0.95 (t, 3H), 1.02 (d, 3H), 1.58 (m, 1H), 1.87 (m, 1H), 3.92 (m, 2H), 7.66 (d, 2H), and 8.54 (d, 2H)

179 parts by mass of DPP and 162.5 parts by mass of 2-(2-benzothiazolyl) acetonitrile were stirred in 1,840 parts by mass of toluene, and 476.74 parts by mass of phosphorus oxychloride was added dropwise, and heating reflux is performed for 3.5 hours. After the reaction was completed, the obtained solution was cooled to an internal temperature of 25° C., and 1,800 parts by mass of methanol was added dropwise over 90 minutes while an internal temperature of 30° C. or less was maintained. After the dropwise addition was completed, the obtained solution was stirred for 30 minutes in room temperature. The precipitated crystal was filtrated, and subsequently was washed with 450 parts by mass of methanol. 2,300 parts by mass of methanol was added to obtained crystals, and then heating reflux was performed for 30 minutes. After the reflux, cooling was performed to 30° C., and then the crystals were filtrated. The obtained crystals were dried with blast air at 40° C. for 12 hours, to obtain 240 parts by mass of (A-1-a).

$^1$H-NMR (CDCl$_3$): δ0.99 (t, 3H), 1.07 (d, 3H), 1.58 (m, 1H), 1.93 (m, 1H), 3.93 (m, 2H), 7.15 (d, 2H), 7.66 (d, 2H), and 8.54 (d, 2H)

<<Synthesization of Compound (A-1)>>

119 parts by mass of diphenylborinic acid 2-aminoethyl ester, 170 parts by mass of (A-1-a), and 2,840 parts by mass of toluene were added, and stirring was performed at an outside temperature of 40° C. 167 parts by mass of titanium tetrachloride was added dropwise to the reaction solution over 30 minutes, and then stirring was performed for 30 minutes. The temperature was increased to an outside temperature of 130° C. and then heating reflux was performed for three hours. The obtained solution was cooled until an internal temperature became 30° C. While the temperature was maintained to an internal temperature of 30° C. or less, 1,620 parts by mass of methanol was added dropwise. After the dropwise addition, the obtained solution was stirred for 30 minutes, precipitated crystal was filtrated, and then washing was performed with 150 parts by mass of methanol. 1,500 parts by mass of methanol was added to obtained crystals, stirring was performed in room temperature, and then the solution was filtrated. 1,500 parts by mass of methanol was further added to the obtained crystals, stirring was performed in room temperature, and then the solution was filtrated. 2,000 parts by mass of THF was added to the filtrate, and crystal was washed by performing heating reflux. 234 parts by mass of the compound (A-1) was obtained by performing blast drying at 40° C. for 12 hours.

<Synthesization of Compound (A-2)>

A-2 was synthesized in the same manner as the method disclosed in paragraph numbers 0191 to 0193 of JP2010-197305A except for using A-2a in the raw material.

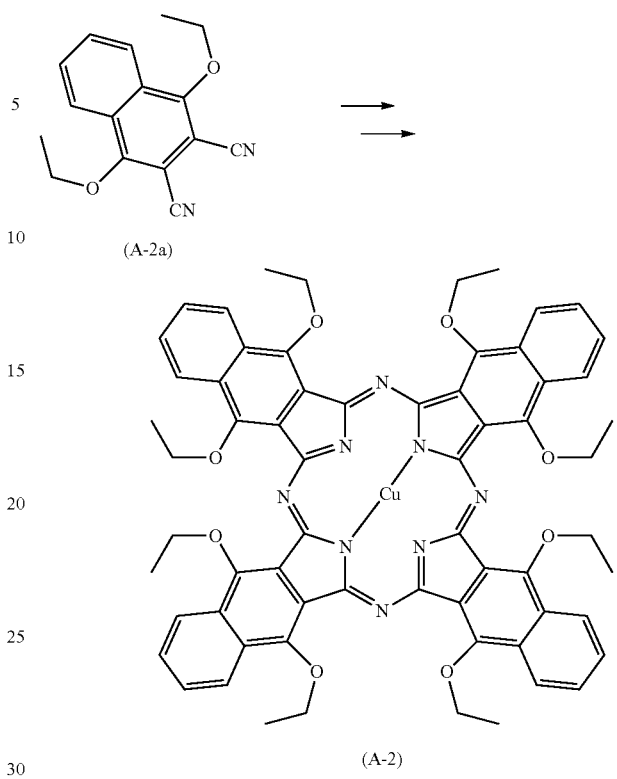

<Synthesization of Resin (B-1)>

4.0 g of a compound M-6 (structure below), 28.73 g of methyl methacrylate, 4.46 g of methacrylic acid, and 79.00 g of ethyl diglycol acetate were heated to 75° C. under a nitrogen stream. While this liquid was stirred, a mixed solution of 0.43 g of dodecanethiol and 2.45 g of ethyl diglycol acetate was added, a mixed solution of 0.40 g of dimethyl 2,2'-azobisisobutyrate [V-601, manufactured by Wako Pure Chemical Industries, Ltd.] and 1.24 g of ethyl diglycol acetate was added, and stirring was performed for two hours. After the stirring, a mixed solution of 0.40 g of dimethyl 2,2'-azobisisobutyrate [V-601, manufactured by Wako Pure Chemical Industries, Ltd.] and 1.24 g of ethyl diglycol acetate was further added, and then stirring is further performed for two hours. After the stirring, a mixed solution of 0.40 g of dimethyl 2,2'-azobisisobutyrate [V-601, manufactured by Wako Pure Chemical Industries, Ltd.] and 1.24 g of ethyl diglycol acetate was further added, stirring was performed for two hours, heating was performed to 90° C., and then stirring was performed for two hours, so as to obtain a resin (B-1). A weight-average molecular weight (Mw: in terms of polystyrene) obtained from GPC (Carrier: tetrahydrofuran (THF)) of the obtained resin was Mw=20,721, and a dispersion degree was Mw/Mn=2.03.

<Synthesization of Resin (B-10)>

A resin (B-10) was obtained by performing synthesization in the same manner as the synthesization example of the resin (B-1), except for using a compound M-11 (structure below) instead of the compound M-6 and using a macromonomer AA-6 (manufactured by Toagosei Co., Ltd.) instead of methyl methacrylate.

(M-6)

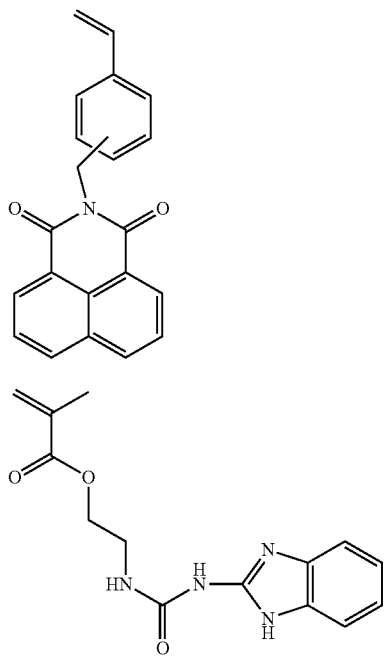

(M-11)

<Synthesization of Resins (B-2) to (B-9), and (B-11) to (B-12)>

Resins (B-2) to (B-9) and (B-11) to (B-12) were synthesized by using corresponding monomers, according to the synthesis method of the resin (B-1).

<Preparation of Processed Coloring Agent>

50 g of an infrared absorption coloring agent, 500 g of sodium chloride, a resin (in a ratio shown in the table below), and 100 g of diethylene glycol were introduced to a stainless steel kneader of one gallon (manufactured by Inoue MFG., Inc.), and kneading was performed for nine hours. Subsequently, this mixture was poured into about three liters of water, stirring was performed for about one hour with a high speed mixer, filtration and water washing were performed, sodium chloride and solvent were removed, and then drying was performed so as to obtain the processed coloring agent. The average primary particle diameter was measured by diluting a pigment dispersion liquid with propylene glycol monomethyl ether acetate, performing dropwise adding to a mesh for electron microscopy, performing TEM observation (TEM: Jeol Ltd., 1200EX, Acceleration voltage: 80 kV, Observation magnification: ×100 K) after drying, and extracting 500 particles.

TABLE 1

| | Near-infrared absorption coloring agent | Resin | Mass ratio of resin with respect to near-infrared absorption coloring agent (%) | Average primary particle diameter (nm) |
|---|---|---|---|---|
| Processed coloring agent 1 | A-1 | B-1 | 60 | 11.5 |
| Processed coloring agent 2 | A-1 | B-2 | 60 | 11.0 |
| Processed coloring agent 3 | A-2 | B-1 | 60 | 12.3 |
| Processed coloring agent 4 | A-1 | B-3 | 55 | 25.4 |
| Processed coloring agent 5 | A-1 | B-4 | 40 | 12.3 |
| Processed coloring agent 6 | A-1 | B-5 | 40 | 12.5 |
| Processed coloring agent 7 | A-1 | B-6 | 40 | 18.4 |

TABLE 1-continued

| | Near-infrared absorption coloring agent | Resin | Mass ratio of resin with respect to near-infrared absorption coloring agent (%) | Average primary particle diameter (nm) |
|---|---|---|---|---|
| Processed coloring agent 8 | A-1 | B-7 | 35 | 12.4 |
| Processed coloring agent 9 | A-1 | B-8 | 20 | 19.1 |
| Processed coloring agent 10 | A-1 | B-9 | 80 | 16.9 |
| Processed coloring agent 11 | A-1 | B-10 | 40 | 24.3 |
| Processed coloring agent 12 | A-1 | B-11 | 0.5 | 17.1 |
| Processed coloring agent 13 | A-1 | B-12 | 15 | 18.8 |

Reference numerals presented in the table above indicate compounds below.

Near-infrared absorption coloring agent: Structure below (A-1 had solubility of 0.1 mass % or less with respect to PGMEA at 25° C., and A-2 had solubility of 0.4 mass % with respect to PGMEA at 25° C.)

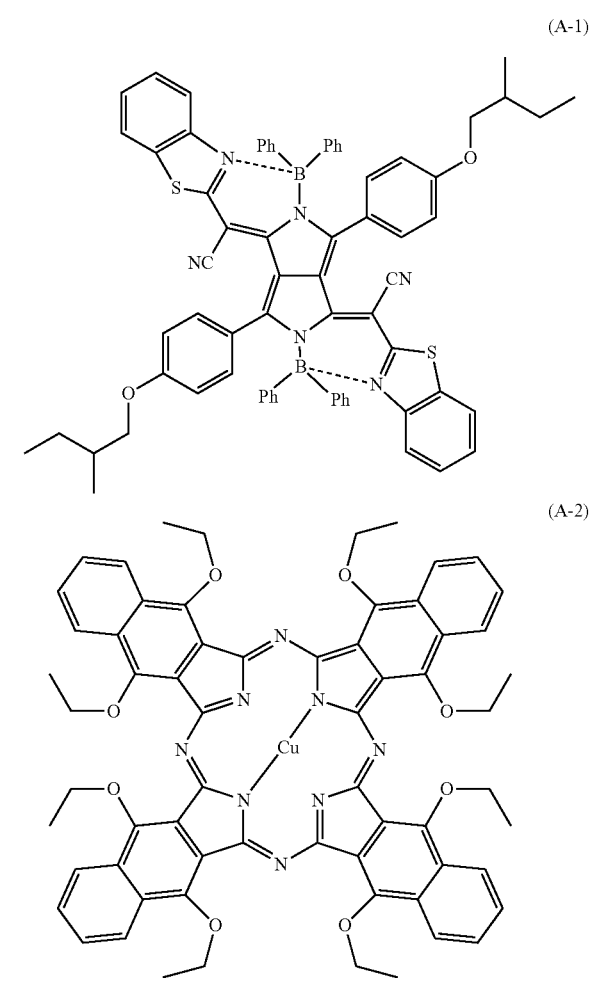

Resin: Resins (B-1) to (B-12) above

TABLE 2

|  | Acid value (mgKOH/g) | Weight-average molecular weight Mw |
|---|---|---|
| B-1 | 85.4 | 20,721 |
| B-2 | 141.1 | 5,629 |
| B-3 | 50.1 | 34,355 |
| B-4 | 0 | 10,222 |
| B-5 | 40.5 | 9,850 |
| B-6 | 99.8 | 30,011 |
| B-7 | 73.3 | 24,507 |
| B-8 | 163.5 | 9,229 |
| B-9 | 210.5 | 7,358 |
| B-10 | 144.8 | 12,279 |
| B-11 | 107.4 | 14,589 |
| B-12 | 123.5 | 200,150 |

<Preparation of Near-infrared Absorption Composition (Coloring Agent Dispersion Liquid)>

Components below were mixed, stirring was performed for three hours at a rotation speed of 3,000 rpm by using a homogenizer, filtration was performed by using DFA4201NXEY (Nylon filter of 0.45 μm) manufactured by Nihon Pall Ltd., and the near-infrared absorption composition was manufactured.

Coloring agent: 95 parts by mass
Coloring agent derivative: 5 parts by mass
Dispersion resin (30% 1-methoxy-2-propyl acetate solution of dispersion resin): 150 parts by mass
Organic solvent: 1-methoxy-2-propyl acetate: 750 parts by mass <Viscosity of Near-infrared Absorption Composition>

The viscosity of the near-infrared absorption composition at 25° C. was measured by using an E-type viscometer and was evaluated in the following criteria.

A: 20 mPa·s or less
B: Greater than 20 mPa·s and 100 mPa·s or less
C: Greater than 100 mPa·s <Thixotropy>

The viscosity of the near-infrared absorption composition in 20 [l/s] at 25° C. and the viscosity in 50 [l/s] were measured by using an E-type viscometer, a Ti value was calculated by a calculation formula below as an index indicating thixotropy and evaluation was performed in a standard below.

Ti value=viscosity in 20 [l/s]/viscosity in 50 [l/s]

A: Ti value<1.1
B: 1.1≤Ti value≤2.0
C: Ti value<2.0

TABLE 3

|  | Coloring agent | Coloring agent derivative | Dispersion resin | Viscosity | Thixotropy |
|---|---|---|---|---|---|
| Example 1 | Processed coloring agent 1 | — | D-1 | A | B |
| Example 2 | Processed coloring agent 2 | C-1 | D-2 | A | A |
| Example 3 | Processed coloring agent 3 | C-4 | D-2 | A | B |
| Example 4 | Processed coloring agent 4 | C-1 | D-5 | A | A |
| Example 5 | Processed coloring agent 5 | C-5 | D-6 | A | A |
| Example 6 | Processed coloring agent 6 | C-3 | D-5 | A | A |
| Example 7 | Processed coloring agent 7 | C-1 | D-4 | A | A |
| Example 8 | Processed coloring agent 8 | C-1 | D-3 | A | A |
| Example 9 | Processed coloring agent 9 | C-2 | D-5 | A | A |
| Example 10 | Processed coloring agent 10 | C-4 | D-5 | A | B |
| Example 11 | Processed coloring agent 11 | C-1 | D-4 | A | A |
| Example 12 | Processed coloring agent 12 | C-1 | D-1 | B | B |
| Example 13 | Processed coloring agent 13 | C-1 | D-2 | A | B |
| Comparative Example 1 | Near-infrared absorption coloring agent A-1 | C-2 | D-5 | B | C |
| Comparative Example 2 | Near-infrared absorption coloring agent A-3 | C-2 | D-5 | C | C |

As clearly understood from the table above, with respect to the near-infrared absorption composition according to the invention, viscosity and a Ti value were low, and dispersibility and thixotropy were satisfactory.

In contrast, in Comparative Examples 1 and 2, viscosity and a Ti value were high and dispersibility and thixotropy were deteriorated.

In Example 1, when the organic solvent was changed to cyclohexanone, ethyl lactate, ethanol, or cyclopentanone, the same effect was able to be obtained.

In Example 1, when a dispersion resin D-1 was changed to dispersion resins D-2 to D-6 in the same amounts, the same effect as Example 1 was able to be obtained.

In Example 2, when a coloring agent derivative C-1 was changed to coloring agent derivatives C-2 to C-5 in the same amounts, the same effect as Example 2 was able to be obtained.

Reference numerals disclosed in the table above represent the compounds below.

Processed coloring agents 1 to 13: Processed coloring agents 1 to 13 above

A-1: Near-infrared absorption coloring agent A-1 above

A-3, C-1 to C-5, and D-1 to D-6: Structures below. Ratios of repeating units of D-1 to D-6 were mass ratios. D-2 and D-4 are resins manufactured by using a macromonomer AA-6 (manufactured by Toagosei Co., Ltd.) as a raw material.

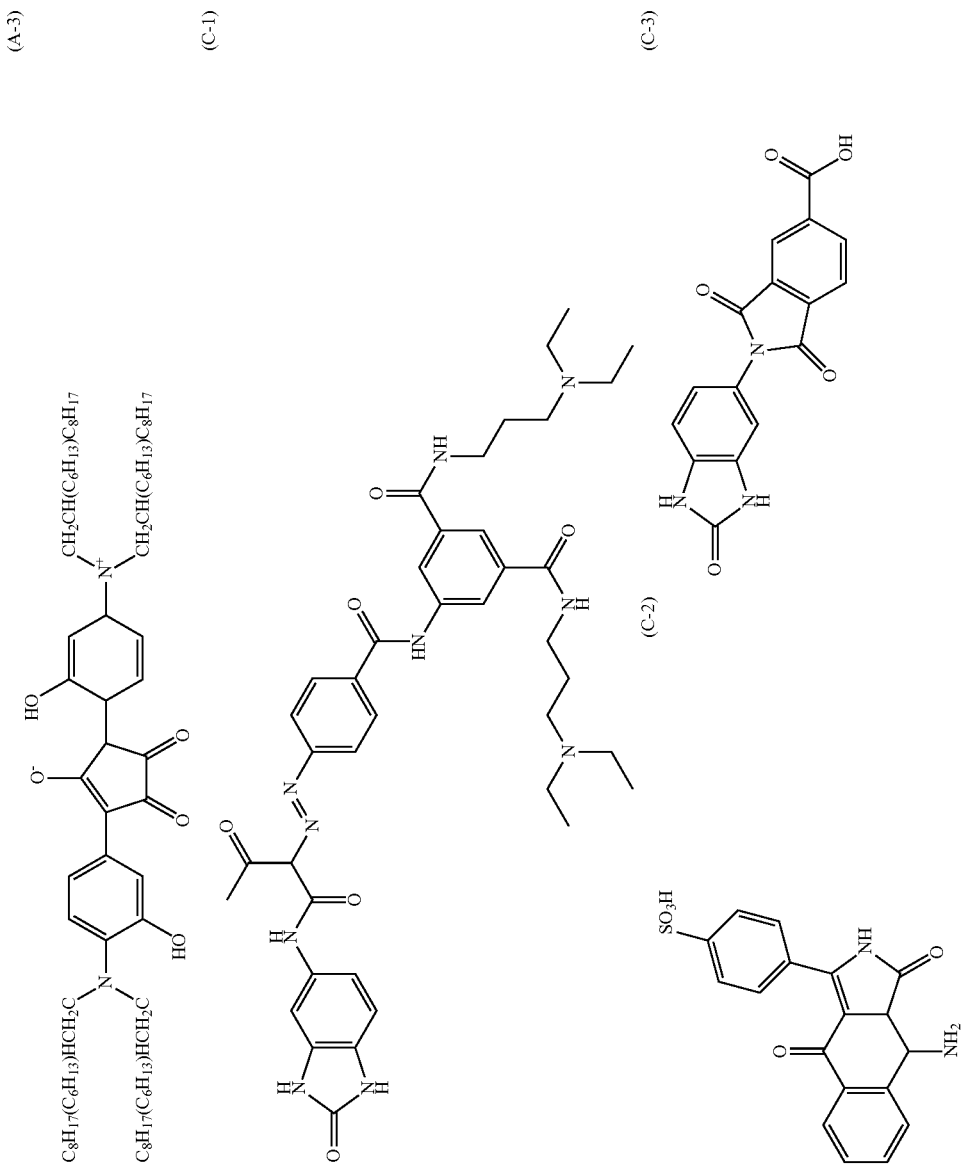

-continued
(C-4)
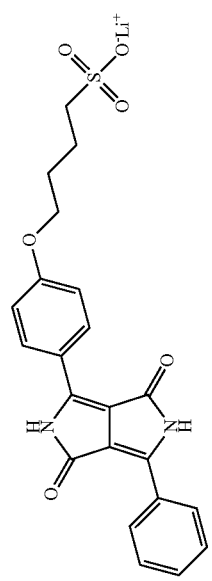
(C-5)
(D-1)
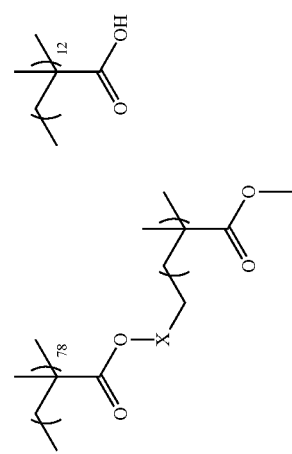
(D-2)
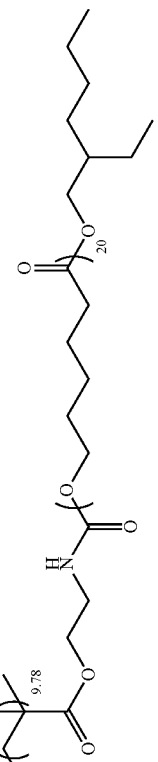
(D-3)
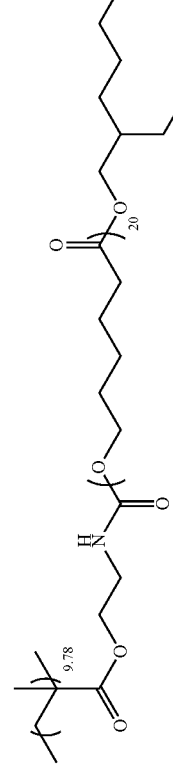
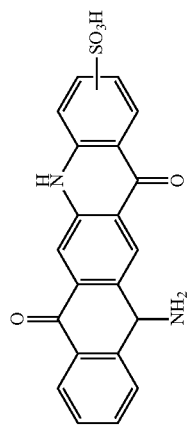
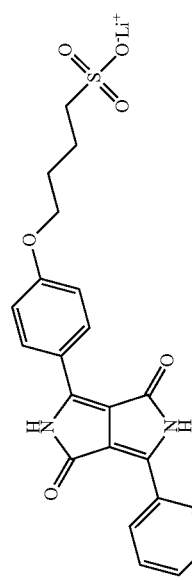
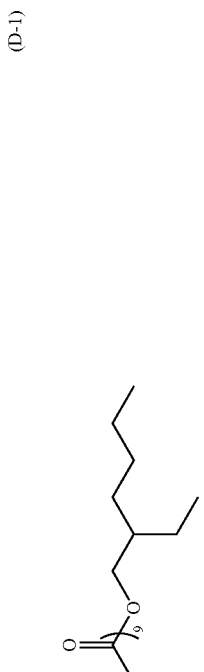
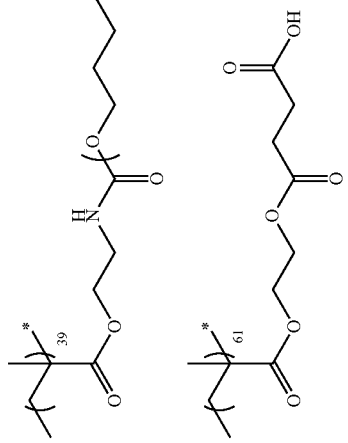
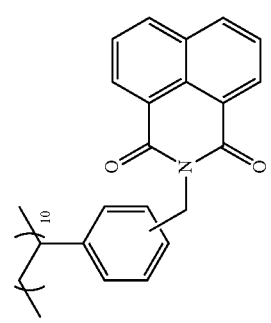
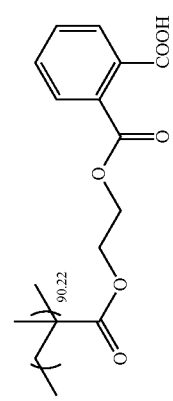

-continued
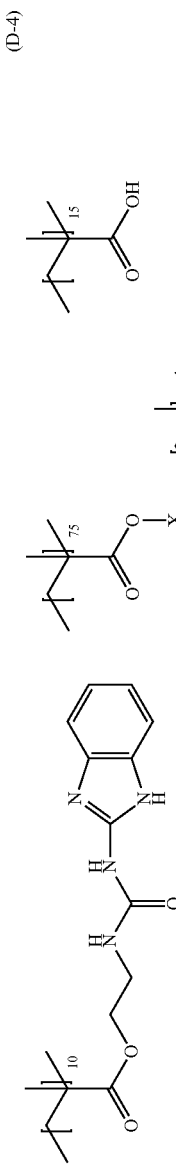
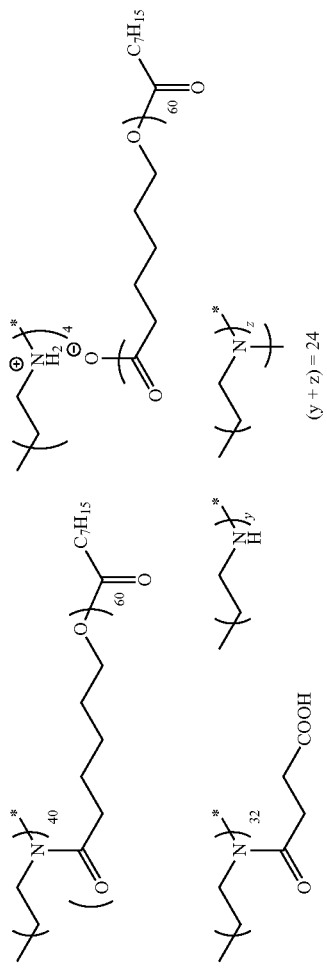
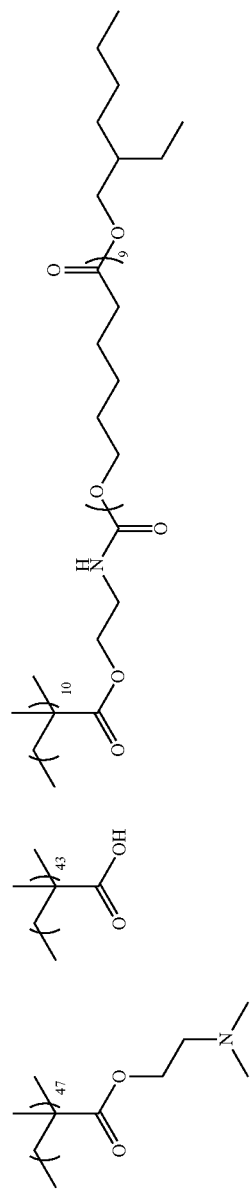

TABLE 4

| | Acid value (mgKOH/g) | Weight-average molecular weight Mw |
|---|---|---|
| D-1 | 49.4 | 25,784 |
| D-2 | 78.1 | 20,169 |
| D-3 | 99.1 | 38,900 |
| D-4 | 94.4 | 19,075 |
| D-5 | 44.3 | 10,424 |
| D-6 | 105.0 | 11,483 |

<Preparation of Curable Composition>

Components below were mixed so as to manufacture the curable composition.

Near-infrared absorption compositions of Examples 1 to 3: 13.5 parts by mass
Polymerizable compound: CYCLOMER P (ACA) 230AA (manufactured by Daicel Corporation): 25 parts by mass
Polymerizable compound: KAYARAD DPHA (manufactured by Nippon Kayaku Co., Ltd.): 3.2 parts by mass
Photopolymerization initiator: IRGACURE OXE01 (manufactured by BASF SE): 2 parts by mass
Polymerization inhibitor: p-Methoxyphenol: 0.001 parts by mass
Surfactant: MEGAFACE F-781F (manufactured by DIC Corporation): 0.004 parts by mass
Organic solvent: Propylene glycol monomethyl ether acetate: 56 parts by mass <Method of Manufacturing Cured Film>

A substrate was coated with a curable composition by a spin coating method, and heating is thereafter performed for two minutes at 100° C. on a hot plate, so as to obtain a curable composition coated layer. The obtained curable composition coated layer was exposed by an exposure amount of 100 mJ/cm$^2$ by using an i-line stepper or an aligner. The coated layer after exposure was subjected to a curing treatment on a hot plate at 230° C. for 5 minutes, so as to obtain a cured film of about 1.5 μm.

The obtained cured film had excellent infrared absorption properties and excellent visible transmission properties.

When KAYARAD DPHA of the polymerizable compound was changed to LIGHT ACRYLATE DCP-A, KAYARAD D-330, KAYARAD D-320, or KAYARAD D-310, the same excellent effect was able to be obtained.

When a photopolymerization initiator was changed to IRGACURE OXE 02, the same effect was able to be obtained.

When propylene glycol monomethyl ether acetate was substituted to cyclopentanone in the same amount, the same effect was able to be obtained.

When filtration by using DFA4201NXEY (Nylon filter of 0.45 μm) manufactured by Nihon Pall Ltd. after respective curable compositions were prepared, the same effect was able to be obtained.

EXPLANATION OF REFERENCES 110 solid-state imaging device
111 near-infrared cut filter
112 color filter
113 infrared transmission filter
114 area
115 microlens
116 planarizing layer
201 lens optical system
210 solid-state imaging device
220 signal processing unit
230 signal switching unit
240 controller
250 signal accumulating unit
260 light emitting controller
270 infrared LED
280, 281 image output units

What is claimed is:

1. A near-infrared absorption composition comprising:
a processed coloring agent obtained by coating at least a portion of surfaces of primary particles of a near-infrared absorption coloring agent with a resin having one or more selected from a coloring agent structure, a heterocyclic structure, and an acyclic hetero atom-containing group,
wherein the near-infrared absorption coloring agent is a compound represented by Formula (1) below,

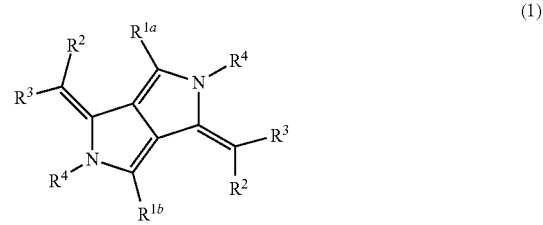

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from $R^{1a}$, $R^{1b}$, and $R^3$, and $R^{4A}$ and $R^{4B}$ each independently represent a hydrogen atom or a substituent.

2. The near-infrared absorption composition according to claim 1,
wherein an average primary particle diameter of the processed coloring agent is 200 nm or less.

3. The near-infrared absorption composition according to claim 1,
wherein the near-infrared absorption coloring agent has a maximum absorption wavelength in a range of 700 to 1,200 nm.

4. The near-infrared absorption composition according to claim 1,
wherein a solubility of the near-infrared absorption coloring agent to a solvent having an SP value of 25 (cal/cm$^3$)$^{0.5}$ or less at 25° C. is 1.0 mass % or less.

5. The near-infrared absorption composition according to claim 1,
wherein the coloring agent structure that the resin of the processed coloring agent has is a coloring agent structure derived from one or more coloring agents selected from a pyrrolopyrrole coloring agent, a quinacridone coloring agent, an anthraquinone coloring agent, a benzoisoindole coloring agent, a thiazine indigo coloring agent, an azo coloring agent, a quinophthalone coloring agent, a phthalocyanine coloring agent, a dioxazine coloring agent, a perylene coloring agent, a perinone coloring agent, a benzimidazolone coloring agent, a benzothiazole coloring agent, a benzimidazole coloring agent, and a benzoxazole coloring agent, wherein the heterocyclic structure that the resin of the processed coloring agent has is one or more selected from thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, dioxane, trithiane, isoindoline, isoindolinone, benzimidazolone, benzimidazole, benzothiazole, succinimide, phthalimide, naphthalimide, hydantoin, indole, quinoline, carbazole, acridine, acridone, and anthraquinone, and wherein the acyclic hetero atom-containing group that the resin of the processed coloring agent has is one or more selected from a urea group, an imido group, an amide group, and a sulfonamide group.

6. The near-infrared absorption composition according to claim 1,
wherein the resin of the processed coloring agent includes one or more selected from a (meth)acrylic resin, a styrene resin, a (meth)acrylic/styrene resin, a urethane resin, an imide resin, a urea resin, an epoxy resin, and an ester resin.

7. The near-infrared absorption composition according to claim 1,
wherein the resin of the processed coloring agent includes one or more selected from a (meth)acrylic resin, a styrene resin, and a (meth)acrylic/styrene resin.

8. The near-infrared absorption composition according to claim 1,
wherein the resin of the processed coloring agent is one selected from a resin having a weight-average molecular weight of 2,000 to 200,000, a resin having an acid value of less than 200 mgKOH/g, and a resin having a weight-average molecular weight of 2,000 to 200,000 and an acid value of less than 200 mgKOH/g.

9. The near-infrared absorption composition according to claim 1,
wherein in the processed coloring agent, a mass ratio of the near-infrared absorption coloring agent and the resin is 1:0.01 to 1:2.

10. A curable composition comprising:
the near-infrared absorption composition according to claim 1; and
a curable compound.

11. A cured film formed of the curable composition according to claim 10.

12. A near-infrared cut filter formed of the curable composition according to claim 10.

13. A solid-state imaging device comprising:
a cured film formed of the curable composition according to claim 10.

14. An infrared sensor comprising:
a cured film formed of the curable composition according to claim 10.

15. A camera module comprising:
a solid-state imaging device; and
the near-infrared cut filter according to claim 12.

16. A processed coloring agent obtained by coating at least a portion of surfaces of primary particles of a near-infrared absorption coloring agent with a resin having one or more selected from a coloring agent structure, a heterocyclic structure, and an acyclic hetero atom-containing group,
wherein the near-infrared absorption coloring agent is a compound represented by Formula (1) below,

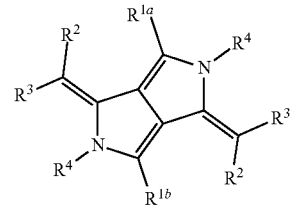

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from $R^{1a}$, $R^{1b}$, and $R^3$, and $R^{4A}$ and $R^{4B}$ each independently represent a hydrogen atom or a substituent.

17. A method of manufacturing a processed coloring agent comprising:
performing a pulverizing treatment on a near-infrared absorption coloring agent in presence of a resin having one or more selected from a coloring agent structure, a heterocyclic structure, and an acyclic hetero atom-containing group,
wherein the near-infrared absorption coloring agent is a compound represented by Formula (1) below,

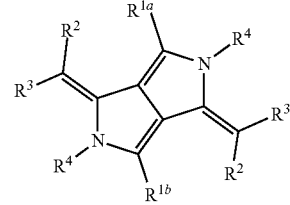

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from $R^{1a}$, $R^{1b}$, and $R^3$, and $R^{4A}$ and $R^{4B}$ each independently represent a hydrogen atom or a substituent.

18. The near-infrared absorption composition according to claim 1,
wherein the processed coloring agent is obtained by coating at least a portion of surfaces of primary particles of the near-infrared absorption coloring agent with the resin having the coloring agent structure, and
the coloring agent structure that the resin of the processed coloring agent has is a coloring agent structure derived from one or more coloring agents selected from a benzoisoindole coloring agent, a thiazine indigo coloring agent, a benzimidazolone coloring agent, a benzothiazole coloring agent, and a benzoxazole coloring agent.

19. The near-infrared absorption composition according to claim 18,
wherein the coloring agent structure that the resin of the processed coloring agent has is a coloring agent structure derived from the benzimidazolone coloring agent.

* * * * *